(12) United States Patent
Sugaya et al.

(10) Patent No.: US 9,905,501 B2
(45) Date of Patent: Feb. 27, 2018

(54) SEMICONDUCTOR DEVICE, EMBEDDED CAPACITOR UNIT, SEMICONDUCTOR PACKAGE, AND METHOD OF MANUFACTURING EMBEDDED CAPACITOR UNIT

(71) Applicant: Panasonic Intellectual Property Management Co., Ltd., Osaka (JP)

(72) Inventors: Yasuhiro Sugaya, Osaka (JP); Hidenori Katsumura, Hyogo (JP); Shinya Tokunaga, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/358,257

(22) Filed: Nov. 22, 2016

(65) Prior Publication Data

US 2017/0077019 A1 Mar. 16, 2017

Related U.S. Application Data

(63) Continuation of application No. PCT/JP2015/002639, filed on May 26, 2015.

(30) Foreign Application Priority Data

May 30, 2014 (JP) .................. 2014-112092

(51) Int. Cl.
*H01L 23/495* (2006.01)
*H01G 4/33* (2006.01)
(Continued)

(52) U.S. Cl.
CPC ....... *H01L 23/49589* (2013.01); *H01G 4/224* (2013.01); *H01G 4/228* (2013.01);
(Continued)

(58) Field of Classification Search
CPC ................................ H01L 23/49589
See application file for complete search history.

(56) References Cited

U.S. PATENT DOCUMENTS 4,308,571 A * 12/1981 Tanei .................... C04B 35/472
361/321.5
2006/0141225 A1 6/2006 Borland

FOREIGN PATENT DOCUMENTS

JP 61-102770 5/1986
JP 5-152506 6/1993
(Continued)

OTHER PUBLICATIONS

International Search Report of PCT application No. PCT/JP2015/002639 dated Aug. 18, 2015.

*Primary Examiner* — Ermias Woldegeorgis
(74) *Attorney, Agent, or Firm* — McDermott Will & Emery LLP

(57) ABSTRACT

Jitter that becomes a problem in a semiconductor part which performs high-speed signal processing is reduced. A semiconductor device includes a heat-resistant metal plate, a capacitor part having a lower electrode, a sintered dielectric part, and an upper electrode that are formed on one or more surfaces of the heat-resistant metal plate, a semiconductor chip fixed on the capacitor part, a wire for electrically connecting a lead frame to the semiconductor chip and the upper electrode, and a mold part in which at least the capacitor part and the semiconductor chip are buried. The semiconductor chip, the electrode, the metal plate, and the like are electrically connected with each other via first, second, and third wires.

13 Claims, 15 Drawing Sheets

(51) Int. Cl.
  *H01G 4/228* (2006.01)
  *H01L 25/00* (2006.01)
  *H01L 23/00* (2006.01)
  *H01G 4/40* (2006.01)
  *H01G 4/224* (2006.01)

(52) U.S. Cl.
  CPC ............... *H01G 4/33* (2013.01); *H01G 4/40* (2013.01); *H01L 23/49541* (2013.01); *H01L 23/49568* (2013.01); *H01L 24/97* (2013.01); *H01L 25/00* (2013.01); *H01L 23/4952* (2013.01); *H01L 23/49551* (2013.01); *H01L 2224/48091* (2013.01); *H01L 2224/48145* (2013.01); *H01L 2224/48247* (2013.01); *H01L 2224/48464* (2013.01); *H01L 2224/83101* (2013.01); *H01L 2224/83192* (2013.01); *H01L 2224/92247* (2013.01); *H01L 2924/181* (2013.01)

(56) References Cited

FOREIGN PATENT DOCUMENTS

| | | | | |
|---|---|---|---|---|
| JP | 5-267557 | 10/1993 | | |
| JP | 05267557 A | * 10/1993 | ............. | H01L 24/49 |
| JP | 11-026290 | 1/1999 | | |
| JP | 2006-019596 | 1/2006 | | |
| JP | 2006019596 A | * 1/2006 | | |
| JP | 2006-191110 | 7/2006 | | |
| JP | 2010-157529 | 7/2010 | | |

* cited by examiner

SEMICONDUCTOR DEVICE, EMBEDDED CAPACITOR UNIT, SEMICONDUCTOR PACKAGE, AND METHOD OF MANUFACTURING EMBEDDED CAPACITOR UNIT

BACKGROUND

1. Technical Field

The present disclosure relates to a semiconductor device, a capacitor unit for a semiconductor device, and a semiconductor package, that are used for an HDMI (registered trademark) device, for example, used in the on-vehicle communication field and the high-speed communication field for portable terminals and the like. The present disclosure also relates to a method of manufacturing a embedded capacitor unit. More specifically, the present disclosure relates to upgrading the characteristics of a semiconductor device for high-speed image communication processing used for a display and the like of high vision (2K) and further for high resolution such as 4 k and 8 k.

2. Description of the Related Art

In a portable terminal, a game machine, a flat television, and the like, high-speed signal processing for high vision and further for 4 k and 8 k is required. In the near future, high speed communication for 2 k and 4 k is also considered to be required in an on-vehicle display. In performing such high-speed signal processing, transmission of a large amount of images at a Gbps level is necessary, and it becomes important to satisfy jitter conditions prescribed in standards.

In order to upgrade such jitter characteristics, it is proposed to incorporate a multilayer ceramic capacitor as a decoupling capacitor, together with a semiconductor chip, into a package. The multilayer ceramic capacitor has an advantage in obtaining large capacitance at low cost. However, in the case of disposing a semiconductor chip and a multilayer ceramic capacitor on the same surface, an electrode area of a multilayer ceramic capacitor needs to be small, and a multilayer ceramic capacitor needs to be mounted for each terminal. However, an area region in which the multilayer ceramic capacitor can be mounted is also limited. Moreover, when a multilayer ceramic capacitor is soldered, it becomes necessary to consider a solder remelting measure in the subsequent reflow process. Further, a multilayer ceramic capacitor needs to be mounted on an outer side of a semiconductor chip, and this mounting also has a problem of increasing a projection area of a semiconductor device.

Against these problems, it is proposed to contain, in a package, a laminated capacitor using a TAB (Tape Automated Bonding). In PTL 2, it is proposed to incorporate, into a package, a capacitor using an insulation film and metal foil, as a decoupling capacitor, on a bottom surface of a semiconductor chip. The proposal will be described in further detail, with reference to FIG. 20.

FIG. 20 is a sectional view of a conventional semiconductor package containing a parallel flat capacitor using an insulation film and metal foil. In FIG. 20, reference numeral 1 denotes a TAB (Tape Automated Bonding). On one surface of TAB 1, semiconductor chip 2 is formed, and on the other surface of TAB 1, metal foil 5 is formed with insulation film 4 interposed between TAB 1 and metal foil 5. Then, TAB 1, insulation film 4, and metal foil 5 form capacitor part 6. Bonding wires 7 electrically connect semiconductor chip 2 with lead frames 8, and other bonding wires 7 electrically connect TAB 1 with lead frames 8.

TAB 1 is a tape-shaped flexible circuit board. The TAB tape has a circuit composed of a copper wire formed by etching, on a film made of polyimide.

However, when capacitor part 6 is formed by using TAB 1, it is difficult to satisfy characteristics required as a decoupling capacitor. One reason is that the use of the TAB tape makes it difficult to perform high-temperature processing at or above 400° C. This is because a polyimide material used for the TAB tape cannot bear 400° C. or above. Further, when the TAB tape is used, a dielectric material used to form capacitor part 6 is limited to processing at less than 400° C. That is, the dielectric material needs to be selected from among dielectric materials that are formed at or below a temperature limit of 300° C. at which the TAB tape can bear. As a result, insulation film 4 that can be formed on the surface of the TAB tape is resin-based and has a low dielectric constant. Consequently, it is difficult in some cases to form a decoupling capacitor having an effect capable of bearing high-speed signal processing, that is, capable of suppressing a variation in a power-supply voltage.

FIG. 21 is a sectional view of a semiconductor package containing a conventional capacitor having a dielectric formed on a lead frame. In FIG. 21, it is proposed to use tantalum oxide ($\in$; about 20 to 27), $BaTiO_3$ ($\in$; about 2000), $SrTiO_3$ ($\in$; 150 to 200), $BaSrTiO_3$ ($\in$; 200 to 450), $PbLaZrTiO_3$ ($\in$; 750 to 4000), or the like, for a dielectric, and use 42FN, 50FN, Kovar, or the like, for a lead frame (PTL 2).

Forming a capacitor by using a heat-resistance metallic material in this way, instead of using the TAB, is considered. However, an exemplary component of Kovar contains Ni by 29 weight percent (wt %), Co by 17 wt %, Si by 0.2 wt %, Mn by 0.3 wt %, and Fe by 53.5 wt %, for example. Further, a main component of 42FN (another name, 42Alloy) is 42Ni—Fe (wt %), and a main component of 50FN is 50Ni—Fe(wt %). Even though these metallic materials have excellent heat resistance, the metallic materials have a problem in that when these metallic materials are heat treated at a high temperature of 300° C. or above, 600° C. or above, or 900° C. or above in a condition that the metallic materials are processed in a lead frame shape having a fine pattern, fine portions are easily deformed.

That is, even when a capacitor is tried to be formed on a lead frame-shaped heat-resistant metal plate having a fine pattern, when the metallic materials are heat treated at 300° C. or above, a polyimide reinforcing member provided to prevent a dimensional change of a fine portion disappears in the middle of the heating. As described above, the polyimide reinforcing member provided to maintain high precision of a lead-frame end shape part disappears when the polyimide reinforcing member is heat treated at high temperature of 300° C. or above or at 400° C. or above. As a result, dimensional accuracy of the lead frame becomes low.

CITATION LIST

Patent Literature

PTL 1: Unexamined Japanese Patent Publication No. H05-152506

PTL 2: Unexamined Japanese Patent Publication No. 2006-019596

SUMMARY

The present disclosure has been made in consideration of the above problems. A embedded capacitor unit to be contained in a semiconductor device is formed using a sintered dielectric on a heat-resistant metal plate provided separately from a lead frame. This embedded capacitor unit is mounted together with a semiconductor chip, onto the lead frame. The semiconductor chip and the embedded capacitor unit are connected, by connecting the embedded capacitor with the lead frame by using a bonding wire. As a result, a semiconductor device is provided. The aim of the present disclosure is to upgrade a stable operation of high-speed communication performance by a semiconductor and jitter characteristics, and to improve noise resistance.

One aspect of the present disclosure provides a semiconductor device including a heat-resistant metal plate, a capacitor part having at least a lower electrode, a sintered dielectric part, and an upper electrode that are formed on one or more surfaces of the heat-resistant metal plate, a semiconductor chip fixed on the capacitor part, a lead frame, a wire for electrically connecting the semiconductor chip to the upper electrode, and a resin mold part in which at least the capacitor part and the semiconductor chip are buried. Further, in the semiconductor device, the semiconductor chip and the upper electrode are electrically connected with each other via a first wire, the semiconductor chip and the lower electrode are electrically connected with each other via a second wire, and the upper electrode and the lead frame are electrically connected with each other via a third wire. Further, in the semiconductor device, the semiconductor chip and the upper electrode are electrically connected with each other via the first wire, the semiconductor chip and a metal plate are electrically connected with each other via the second wire, and the upper electrode and the lead frame are electrically connected with each other via the second wire. Accordingly, a capacitance of the capacitor contained in the semiconductor device can be increased. Capacitance components necessary in the semiconductor chip can be freely supplied via the first and second wires. Therefore, jitter in the signal processing can be substantially reduced. Further, noise resistance from the outside can be improved.

Another aspect of the present disclosure provides a semiconductor device including a heat-resistant metal plate, a capacitor part having at least a sintered dielectric part, an upper electrode, and an upper auxiliary electrode in contact with the upper electrode that are formed on one or more surfaces of the heat-resistant metal plate, a semiconductor chip fixed on the capacitor part, a lead frame, a wire for electrically connecting the semiconductor chip to the upper electrode, and a resin mold part in which at least the capacitor part and the semiconductor chip are buried. Further, in the semiconductor device, the semiconductor chip and the upper auxiliary electrode are electrically connected with each other via the first wire, the semiconductor chip and a metal plate are electrically connected with each other via the second wire, and the upper electrode and the lead frame are electrically connected with each other via a third wire. Accordingly, a capacitance of the capacitor contained in the semiconductor device can be increased. Capacitance components necessary in the semiconductor chip can be freely supplied via the first and second wires. Therefore, jitter in the signal processing can be substantially reduced.

Still another aspect of the present disclosure provides a semiconductor device including a heat-resistant metal plate, a capacitor part having at least a lower electrode, a sintered dielectric part, an upper electrode, and a lower auxiliary electrode in contact with the lower electrode that are formed on one or more surfaces of the heat-resistant metal plate, a semiconductor chip fixed on the capacitor part, a lead frame, a wire for electrically connecting the semiconductor chip to the upper electrode, and a resin mold part in which at least the capacitor part and the semiconductor chip are buried. Further, in the semiconductor device, the semiconductor chip and the upper electrode are electrically connected with each other via the first wire, the semiconductor chip and the lower auxiliary electrode are electrically connected with each other via the second wire, and the upper electrode and the lead frame are electrically connected with each other via a third wire. Accordingly, a capacitance of the capacitor contained in the semiconductor device can be increased. Capacitance components necessary in the semiconductor chip can be freely supplied via the first and second wires. Therefore, jitter in the signal processing can be substantially reduced.

According to the present disclosure, as described above, the capacitance of the capacitor contained in the semiconductor device can be increased. Further, capacitance components necessary in the semiconductor chip can be freely supplied with excellent transient response via the first and second wires. Therefore, swing of a power-supply voltage can be suppressed, and jitter in the signal processing can be substantially reduced as a working effect. In the electronic device required to achieve high-speed signal processing represented by high vision and by 4 k and 8 k, it becomes possible to satisfy standard conditions to satisfy the high-speed signal processing. It becomes easy to improve performance of the device.

BRIEF DESCRIPTION OF THE DRAWINGS

FIG. 7 shows a state in which the embedded capacitor unit is mounted on a lead frame by using a conductive adhesive agent and the like;

DETAILED DESCRIPTION

Hereinafter, examples of exemplary embodiments according to the present disclosure will be described.

First Exemplary Embodiment

A semiconductor device according to the present disclosure will be described with reference to a first exemplary embodiment.

Figure 1:
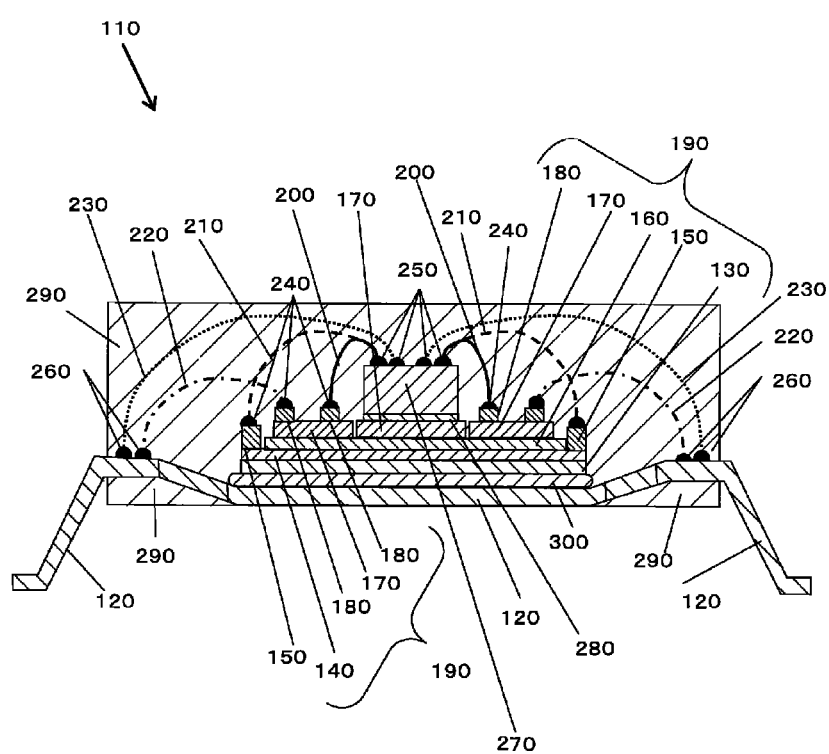
FIG. 1 is a sectional view of a semiconductor device according to the present disclosure.

FIG. 1 is a sectional view, as an example, of a semiconductor device according to the present disclosure. In FIG. 1, reference numeral 110 denotes a semiconductor device, reference numeral 120 denotes a lead frame, reference numeral 130 denotes a heat-resistant metal plate, reference numeral 140 denotes a lower electrode, reference numeral 150 denotes a lower auxiliary electrode, reference numeral 160 denotes a sintered dielectric part, and reference numeral 170 denotes an upper electrode. Further, reference numeral 180 denotes an upper auxiliary electrode, reference numeral 190 denotes a embedded capacitor part, reference numeral 200 denotes a first wire, reference numeral 210 denotes a second wire, reference numeral 220 denotes a third wire, reference numeral 230 denotes a fourth wire, reference numeral 240 denotes an electrode bonding part, reference numeral 250 denotes a semiconductor bonding part, reference numeral 260 denotes an LF (lead frame) bonding part, reference numeral 270 denotes a semiconductor chip, reference numeral 280 denotes a die attach part, reference numeral 290 denotes mold part, and reference numeral 300 denotes a conductive adhesive part.

As shown in FIG. 1, semiconductor device 110 according to the present disclosure has heat-resistant metal plate 130, and at least sintered dielectric 160 and upper electrode 170 that are formed on one or more surfaces of heat-resistant metal plate 130. Then, at least heat-resistant metal plate 130, sintered dielectric 160, and upper electrode 170 form embedded capacitor part 190. Semiconductor device 110 has first wire 200 for electrically connecting semiconductor chip 270 fixed on embedded capacitor part 190 and lead frame 120 with upper electrode 170. Semiconductor device 110 further has second wire 210 for electrically connecting semiconductor chip 270 with lead frame 120, with lower electrode 140, or with lower auxiliary electrode 150. Semiconductor device 110 further has third wire 220 for electrically connecting upper electrode 170 or upper auxiliary electrode 180 with lead frame 120. Semiconductor device 110 further has fourth wire 230 for electrically connecting semiconductor chip 270 with lead frame 120.

First wire 200, second wire 210, third wire 220, fourth wire 230, embedded capacitor part 190, and semiconductor chip 270 are buried in mold part 290, and configure semiconductor device 110. Depending on needs, a back surface side of lead frame 120 to which embedded capacitor part 190 is fixed with conductive adhesive part 300 interposed between embedded capacitor part 190 and lead frame 120 may be exposed from mold part 290. With this arrangement, heat dissipation of semiconductor device 110 can be enhanced, and noise resistance characteristics can be enhanced by realizing direct connection between a main board and a grounding electrode.

As shown in FIG. 1, semiconductor chip 270 and upper electrode 170 are electrically connected with each other via first wire 200. Further, semiconductor chip 270 and heat-resistant metal plate 130 are electrically connected with each other via second wire 210. Further, upper electrode 170 and lead frame 120 are electrically connected with each other via third wire 220. With this connection, at predetermined positions of lead frame 120 and semiconductor chip 270, the embedded capacitor part can be electrically connected by using wire bonding at necessary positions of the semiconductor chip, via first wire 200 to third wire 220.

In this case, a connection portion between semiconductor chip 270 and first wire 200, and a connection portion between semiconductor chip 270 and second wire 210 may be semiconductor bonding parts 250. In bonding, a ball is formed at a wire end by melting a wire metal by discharge or the like. This ball portion may be used as semiconductor bonding part 250. Wire bonding may be performed on semiconductor bonding part 250, by using a bonding method not forming a ball (by wedge bonding, for example). Electrode bonding part 240 and LF bonding part 260 may be also ball portions similar to semiconductor bonding part 250.

Similarly, connection parts between first wire 200 and upper electrode 170, upper auxiliary electrode 180, lower electrode 140 and lower auxiliary electrode 150 and connection parts between third wire 220 and upper electrode 170, upper auxiliary electrode 180, lower electrode 140 and lower auxiliary electrode 150 may be electrode bonding parts 240. A connection part between lead frame 120 and third wire 220, and a connection part between lead frame 120 and fourth wire 230 may be LF bonding parts 260. With this arrangement, via first wire 200 to fourth wire 230, semiconductor chip 270 and lead frame 120 can be electrically connected to embedded capacitor part 190 at predetermined positions. Accordingly, embedded capacitor part 190 can be connected, as a kind of decoupling capacitor, longitudinally and horizontally to optional positions of semiconductor chip 270, by using first wire 200 to fourth wire 230.

As shown in FIG. 1, embedded capacitor part 190 can be fixed onto lead frame 120, via conductive adhesive part 300. Further, semiconductor chip 270 is fixed onto upper electrode 170 of embedded capacitor part 190, via die attach part 280 composed of a die attach film or the like.

First wire 200 and third wire 220 may be directly bonded onto upper electrode 170. However, by bonding first wire 200 and third wire by using upper auxiliary electrode 180, stability of the bonding can be enhanced.

By bonding, in this way, first wire 200 and third wire not onto upper electrode 170 but onto upper auxiliary electrode 180 provided on upper electrode 170, influences applied to sintered dielectric 160 of heat, ultrasonic wave, and pressure necessary for bonding can be suppressed. When upper auxiliary electrode 180 is provided on upper electrode 170, a thickness of upper auxiliary electrode 180 is preferably 5 μm or above, more preferably, 10 μm or above. In this case, 5 μm may be described as 5 um, and 10 μm may be described as 10 um. When the thickness of upper electrode 170 is less than 5 μm, or further, less than 2 μm, microcracks occur in sintered dielectric 160, and pull strength of the bonding wire cannot be obtained, depending on a bonding condition.

Wires like second wire 210 may be directly bonded onto lower electrode 140, or may be bonded onto lower auxiliary electrode 150, having a thickness of 5 μm or above, provided in superposition with lower electrode 140. By bonding the wires not onto upper electrode 170 but onto lower auxiliary electrode 150 provided on lower electrode 140, height for bonding can be obtained. Therefore, bonding stability can be enhanced. When lower auxiliary electrode 150 is provided on lower electrode 140, a thickness of upper auxiliary electrode 180 is preferably 5 μm or above, more preferably, 10 μm or above. More preferably, a thickness of upper auxiliary electrode 180 is 20 μm or above, depending on a dielectric thickness and an electrode thickness. When the thickness of lower electrode 140 is 5 μm or below, or lower than 2 μm, an effect of the auxiliary electrode by bonding cannot be obtained in some cases.

In FIG. 1, lower electrode 140 is provided between heat-resistant metal plate 130 and sintered dielectric 160. However, lower electrode 140 may be omitted. When lower electrode 140 is omitted, embedded capacitor part 190 is configured by heat-resistant metal plate 130, sintered dielectric 160, and upper electrode 170. When lower electrode 140 is omitted, lower auxiliary electrode 150 may be directly formed on heat-resistant metal plate 130 (not shown). It is useful to directly form lower auxiliary electrode 150 on heat-resistant metal plate 130, and perform wire bonding to lower auxiliary electrode 150. Bonding stability can be enhanced by bonding to the lower auxiliary electrode directly formed on heat-resistant metal plate 130, by not bonding to a surface of heat-resistant metal plate 130 on a surface of which an oxide film is formed by heat treatment.

As shown in FIG. 1, by using heat-resistant metal plate 130, a thermosetting dielectric (a dielectric material formed by dispersing a dielectric such as barium titanium oxide in an epoxy resin or the like) that is thermally cured at 200° C. to 300° C. can be used as a dielectric material. However, for a dielectric material, a sintered dielectric obtained by firing at 800° C. or above, more preferably, 850° C. or above is used as sintered dielectric 160. In the case of a thermosetting dielectric, a dielectric constant (K) is low at about 10 to 50. However, by using sintered dielectric 160 as a dielectric, the dielectric constant (K) can be enhanced to about 500. By using sintered dielectric 160 in this way, a capacitance value of embedded capacitor part 190 can be enhanced, and electrical characteristics and reliability can be enhanced. Further, by using sintered dielectric 160, the sintered dielectric can be applied to wire bonding.

As sintered dielectric 160, a sintered dielectric obtained by heat treatment at high temperature of 600° C. or above is preferable, more preferably, 800° C. or above. By heat treatment at high temperature of 600° C. or above, a resin component and the like of a low dielectric constant (K) contained in the dielectric can be removed. Further, by heat treatment at high temperature of 800° C. or above, denseness of a dielectric by sintering can be enhanced, and the dielectric constant (K) and insulation characteristics of the dielectric can be enhanced.

In semiconductor device 110 according to the present disclosure, it is useful to provide a polyimide film and the like bonded to a plurality of lead frames 120 to avoid changes in positions of lead frames 120. However, the polyimide film and the like provided to hold the positions of the end portions of lead frames 120 are not shown in FIG. 1.

Figure 2:
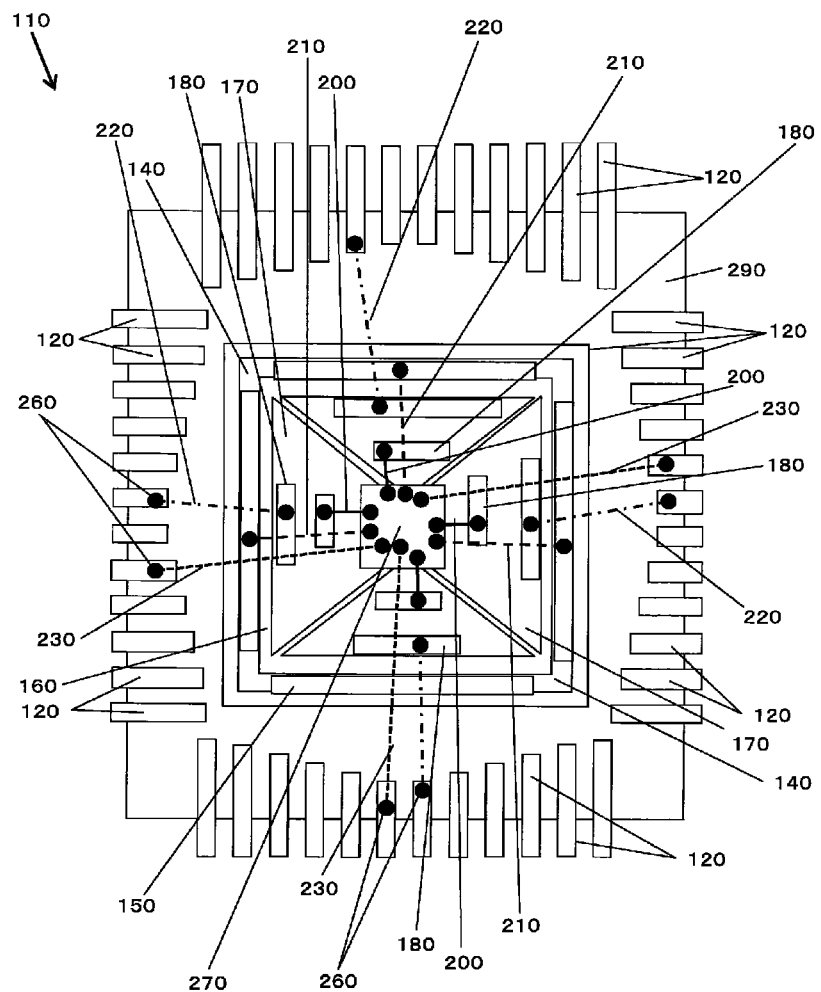
FIG. 2 is a top view of the semiconductor device shown in FIG. 1.

FIG. 2 is a top view, as an example, of the semiconductor device shown in FIG. 1. FIG. 2 schematically illustrates an internal structure of semiconductor device 110 by not showing mold part 290 and the like formed on semiconductor device 110.

As shown in FIG. 2, on four sides of semiconductor device 110, lead frames 120 are formed such that a part of each lead frame 120 is projected from mold part 290. At a center part of semiconductor device 110, embedded capacitor part 190 and semiconductor chip 270 fixed on embedded capacitor part 190 are formed. Via first wire 200, semiconductor chip 270 is electrically connected with upper electrode 170 or with upper auxiliary electrode 180 formed on upper electrode 170. Similarly, via second wire 210, semiconductor chip 270 is electrically connected with lower electrode 140 or with lower auxiliary electrode 150 formed on lower electrode 140, or is electrically connected with heat-resistant metal plate 130 (not shown) or with lower auxiliary electrode 150 formed on heat-resistant metal plate 130. Similarly, via third wire 220, upper electrode 170 or upper auxiliary electrode 180 formed on upper electrode 170 is electrically connected with lead frame 120. Similarly, via fourth wire 230, semiconductor chip 270 is electrically connected with lead frame 120. In this way, a terminal (not shown) of semiconductor chip 270 and a plurality of upper electrodes 170 provided on embedded capacitor part 190 or upper auxiliary electrode 180 formed on upper electrode 170 can be connected with each other, in an optimum structure, by short wiring, using various wires. Accordingly, it is possible to reduce swing of a power-supply voltage attributable to output from semiconductor chip 270 or attributable to charge supply excellent in transient response in lead frame 120 that extends from semiconductor device 110 to outside. As a working effect of the reduction in swing of a power-supply voltage, jitter of a signal can be substantially reduced.

As shown in FIG. 2, upper electrode 170 and upper auxiliary electrode 180 that configure a part of embedded capacitor part 190 are usefully provided plurally or in a plurality of patterns mutually insulated. By providing upper electrode 170 and upper auxiliary electrode 180 that configure a part of embedded capacitor part 190 plurally or in a plurality of patterns mutually insulated as described above, the plurality of upper electrodes 170 and upper auxiliary electrodes 180 can be individually connected by using first wires 200 and third wires 220. By providing in this way upper auxiliary electrodes 180 in a plurality of patterns mutually insulated, a plurality of mutually independent decoupling capacitors can be formed using one embedded capacitor part 190. As a result, optimized design of jitter reduction of semiconductor chip 270 becomes possible.

In semiconductor device 110 according to the present disclosure, a pattern shape of upper electrode 170, an electrode area, and numbers of components can be freely designed. Therefore, in the present disclosure, by providing optimized design of a pattern shape of upper electrode 170, a power supply dividing pattern capable of drawing maximum characteristics of semiconductor device 110 can be realized. That is, by providing semiconductor device 110 according to the present disclosure, each of a plurality of power supply systems required in semiconductor chip 270 can be patterned such that a relatively larger area can be allocated to a power supply system that requires largest capacitance. Therefore, also for semiconductor chip 270 of a large variation in characteristics, a necessary decoupling capacitor can be formed for each power supply system of semiconductor chip 270 such that operation of semiconductor chip 270 can be stabilized. Further, by building semiconductor chip 270 into semiconductor device 110 according to the present disclosure, needless to mention, EMC (Electro Magnetic Compatibility) characteristics can be enhanced, including stabilizing a power-supply voltage, reducing jitter, and improving resistance of noise from the outside.

Second Exemplary Embodiment

In a second exemplary embodiment, one example of a method of manufacturing the embedded capacitor unit to be used in semiconductor device 110 described in the first exemplary embodiment and a structure thereof will be described with reference to FIG. 3A to FIG. 6B.

Figure 3A:
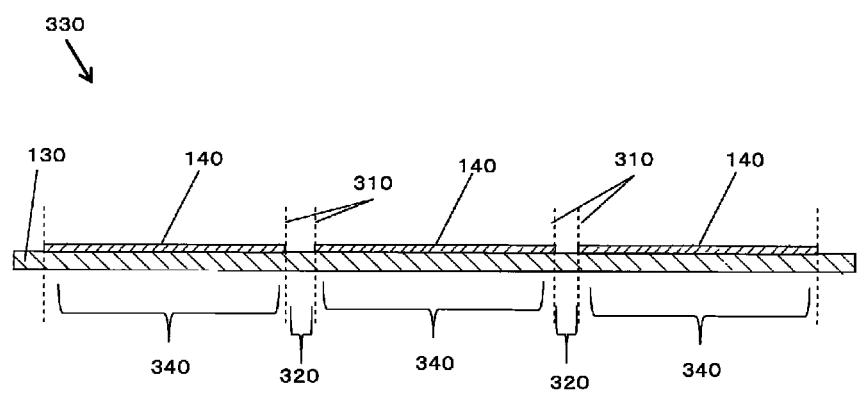
FIG. 3A shows an example of a method of manufacturing a embedded capacitor unit to be contained in a semiconductor device.
Figure 3B:
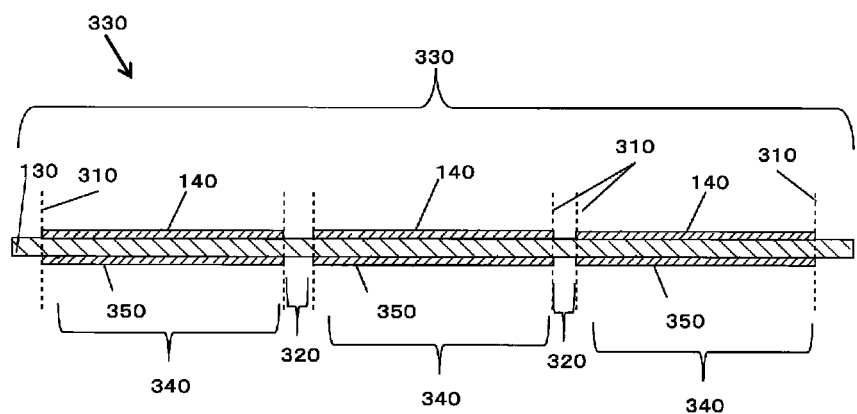
FIG. 3B shows an example of a method of manufacturing a embedded capacitor unit to be contained in a semiconductor device.

FIG. 3A and FIG. 3B each show an example of a method of manufacturing a embedded capacitor unit to be contained in a semiconductor device. In FIG. 3A and FIG. 3B, reference numeral 310 denotes an auxiliary line, and auxiliary line 310 indicates a segmentation size. Further, reference numeral 320 denotes a gap, reference numeral 330 denotes a multiple unit, reference numeral 340 denotes a single unit, and reference numeral 350 denotes a dummy electrode.

First, as shown in FIG. 3A, heat-resistant metal plate 130 is provided. As a heat-resistant metal plate, there is selected a metal member having a thickness of 50 μm or above and having heat resistance (for example, a metal member that bears firing at 850° C. to 950° C. in an oxidation atmosphere, or a metal member that does not lose flatness at a heating time). Then, lower electrodes 140 are formed by using a screen printing technique or the like, on one or more surfaces of heat-resistant metal plate 130. As lower electrode 140, it is useful to use commercially available Ag electrode paste for sintering that contains silver by 50 wt % or more and 100 wt % or less, or AgPd electrode paste for sintering that contains silver by 50 wt % or more, both bases meeting firing at about 850° C. to 950° C. Then, this electrode paste (a first electrode paste) is formed on one surface of heat-resistant metal plate 130 so as to provide gap 320, as shown by auxiliary line 310 in FIG. 3A. By forming lower electrode 140, capacitor characteristics can be enhanced, and wire bonding properties of a capacitor portion can be enhanced.

When the thickness of heat-resistant metal plate 130 is 50 μm or below, flatness of heat-resistant metal plate 130 becomes low and the heat-resistant metal plate is deformed in some cases. In order to prevent deformation or warpage of the heat-resistant metal plate at a heat treatment time, it is useful to form dummy electrode 350 on the other one surface of heat-resistant metal plate 130, as shown in FIG. 3B, for example. The commercially available Ag electrode paste or AgPd electrode paste that meets firing at about 850° C. to 950° C. is used as dummy electrode 350. As a result, occurrence of warpage and distortion in heat-resistant metal plate 130 attributable to thermal expansion coefficients of heat-resistant metal plate 130, lower electrode 140, sintered dielectric 160, and upper electrode 170 at a firing time can be prevented. At the same time, dummy electrode 350 can be used as a part of an electrode of the heat-resistant metal plate. Dummy electrode 350 described with reference to FIG. 3B is not shown in FIG. 4 and other drawings described later. However, providing dummy electrode 350 depending on needs is useful.

In FIG. 3A and FIG. 3B, single unit 340 corresponds to each individual embedded capacitor unit. Further, as shown in FIG. 3A and FIG. 3B, it is useful to manufacture multiple unit 330 including a plurality of single units 340 arranged in the XY direction with gap 320 interposed therebetween. By handing single units 340 as multiple unit 330, variation in characteristics between embedded capacitors to be formed in single units 340 can be reduced. Further, from the aspect of productivity and inspection easiness, manufacturing cost can be reduced. As an example, dimension of single unit 340 is 9 mm×9 mm, the gap as a disconnection margin indicated by auxiliary line 310 is 1 mm, and external dimension of multiple unit 330 is 300 mm×400 mm. In this case, 12 single units 340 can be obtained at one time from one multiple unit. Further, in a condition of multiple unit 330, electric inspection of embedded capacitor part 190 formed in each single unit 340 may be carried out.

Figure 4:
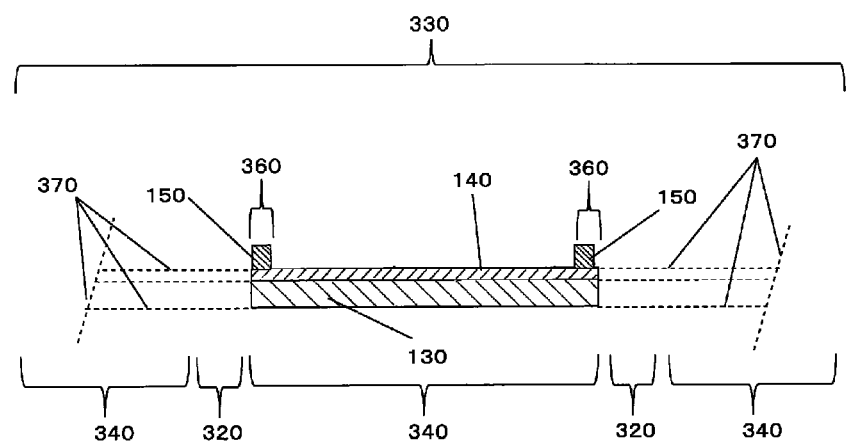
FIG. 4 shows a case in which a upper auxiliary electrode is further provided on a upper electrode.

FIG. 4 shows a case in which a lower auxiliary electrode is further provided in superposition with the lower electrode. Specifically, FIG. 4 shows a case in which lower auxiliary electrodes 150 are provided on lower electrode 140. In FIG. 4, reference numeral 360 denotes a bonding area. By using bonding area 360 as lower auxiliary electrode 150 as shown in FIG. 4, workability at a wire bonding time can be enhanced. That is, by performing wire bonding on lower auxiliary electrode 150, adhesiveness of wire bonding can be more secured, and pull strength can be enhanced. From the aspect of stably performing bonding, useful width and length of lower auxiliary electrode 150 are preferably 100 μm or above, and more preferably, 200 μm or above. Further, a pattern shape of lower auxiliary electrode 150 can be made optional. Therefore, it is also useful to use pattern shape of lower auxiliary electrode 150 for alignment mark in each process. Bonding area 360 is not necessarily limited to an upper side of lower auxiliary electrode 150, and may be an upper side of lower electrode 140 or an upper side of heat-resistant metal plate 130 (not shown). Lower auxiliary electrode 150 may be directly formed on heat-resistant metal plate 130.

In FIG. 4, as a formation material of lower auxiliary electrode 150 to be formed on lower electrode 140, it is possible to use commercially available Ag electrode paste or AgPd electrode paste for sintering, containing silver by 50 wt % or more and 100 wt % or less that meets firing at about 850° C. to 950° C. Further, when electrode paste, lower electrode 140 and lower auxiliary electrode 150 that are formed by sintering the electrode paste include a glass component by 10 wt % or 5 wt %, or are glassless (less than 0.1 wt %), wire bonding properties can be enhanced, and cofiring ability can be enhanced.

FIG. 4 shows one single unit 340 that configures a part of multiple unit 330. In FIG. 4, other single units are omitted by using dotted lines 370.

Figure 5:
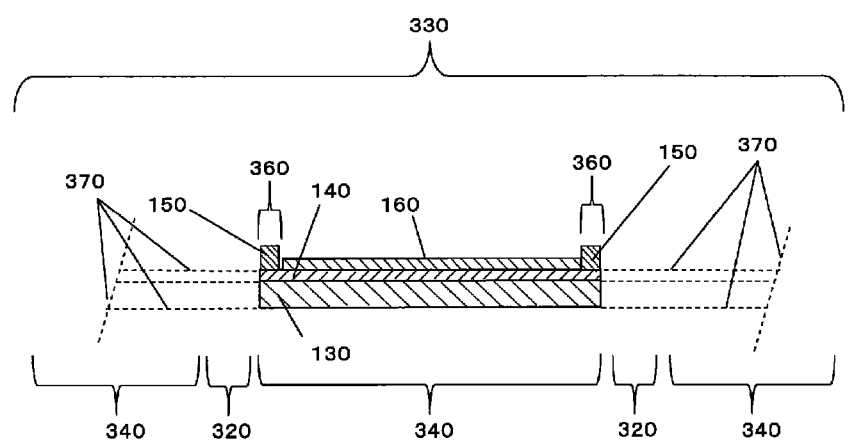
FIG. 5 shows a state in which a dielectric part is formed on the upper electrode.

FIG. 5 shows a state in which a dielectric part is formed on the upper electrode. In FIG. 5, as a dielectric that configures sintered dielectric 160, it is useful to use BTO (barium titanium oxide dielectric). After the dielectric paste containing BTO is printed in a predetermined pattern, sintered dielectric 160 can be formed by sintering at around 900° C. (preferably 850° C. or above or 950° C. or below. At less than 850° C., dielectric characteristics of sintered dielectric 160 become low in some cases. In order to firing at higher temperature than 950° C., a special material needs to be selected for the heat-resistant metal plate). By adding various additives to the dielectric material using this BTO as a main component, a dielectric constant and temperature characteristics of the dielectric constant, and sintering start temperature can be regulated.

As a sintered dielectric configuring sintered dielectric 160, it is useful to select, by considering usage and environment, dielectric materials such as SBT (strontium bismuth tantalite) and BLT (bismuth lanthanum titanate), in addition to BTO (barium titanium oxide). When high frequency characteristics are required as a decoupling capacitor, a dielectric material known for high frequency may be appropriately selected and used as a dielectric configuring sintered dielectric 160.

Figure 6A:
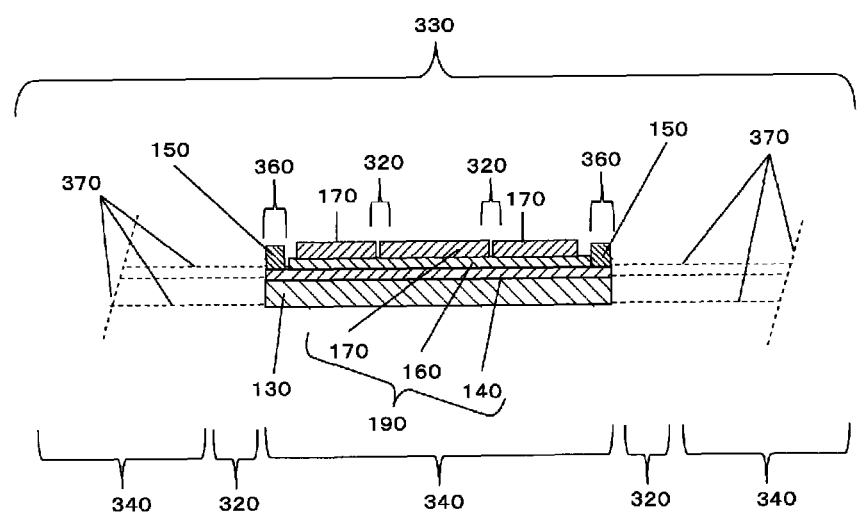
FIG. 6A shows a state in which a plurality of upper electrodes are formed on a dielectric.
Figure 6B:
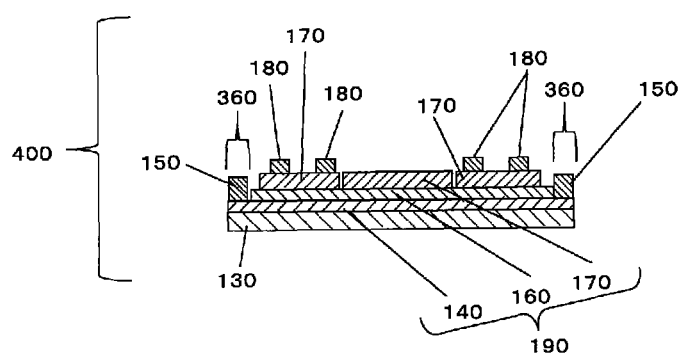
FIG. 6B is a sectional view of a completed embedded capacitor part.

FIG. 6A shows a state in which a plurality of upper electrodes are formed on a dielectric and FIG. 6B is a sectional view of a completed embedded capacitor part. In FIG. 6A and FIG. 6B, reference numeral 400 denotes an example of a embedded capacitor unit.

FIG. 6A shows a state of forming upper electrodes 170 in a condition of multiple unit 330. In order to form upper electrodes 170 on sintered dielectric 160, it is useful to use commercially available Ag electrode paste or AgPd electrode paste that meets firing at about 850° C. to 950° C.

By forming gap 320 between a plurality of upper electrodes 170, embedded capacitor part 190 composed of lower electrode 140, sintered dielectric 160, and upper electrode 170 can become a plurality of independent decoupling capacitors. Thereafter, depending on needs, upper auxiliary electrode 180 is formed on upper electrode 170, by using commercially available Ag electrode paste or AgPd electrode paste that meets firing at about 850° C. to 950° C. Lower electrode 140, sintered dielectric 160, and upper electrode 170 may be individually fired after printing electrode paste and dielectric paste, or may be collectively fired after forming a laminated body by printing and drying the electrode paste and the dielectric paste. Lower electrode 140 and upper electrode 170 formed by individual firing or collective firing are sintered electrodes. Depending on needs, each of sintered dielectric 160 and lower electrode 140 may be in two or more layers. In a condition of lamination in two or more layers, these members may be fired collectively. For such member firing, a commercially available mesh belt furnace (for example, in/out time is about 30 minutes to 2 hours, and highest temperature is 850° C. to 950° C.) can be used. In order to stably exclude binder contained in the paste, it is also useful to perform firing by taking time in a temperature raising process using a batch furnace.

As shown in FIG. 6A and FIG. 6B, it is useful to form a plurality of upper electrodes 170 that are mutually electrically insulated, on one sintered dielectric 160. By forming a plurality of upper electrodes 170 on one sintered dielectric 160 as a kind of electrode dividing pattern (a sintered electrode), it is possible to provide a decoupling capacitor for individually meeting a plurality of power supply systems held by semiconductor chip 270. By providing in this way a plurality of upper electrodes 170 mutually insulated on one sintered dielectric 160, there are formed a plurality of decoupling capacitors of which temperature characteristics and dielectric constants are mutually uniform.

Depending on needs, upper auxiliary electrode 180 may be provided in superposition with upper electrode 170. Thereafter, multiple unit 330 provided in this way is divided or disconnected into single units 340 via gap 320. In single unit 340, predetermined characteristics evaluation (evaluation of a capacitance value, and evaluation of insulation performance and evaluation of a leakage current) may be performed in a condition of multiple unit 330 from the aspect of workability. By setting heat-resistant metal plate 130 and lower electrode 140 and lower auxiliary electrode 150 formed on the surface of heat-resistant metal plate 130 as grounding electrodes at an inspection time, characteristic inspection can be stabilized. Single unit 340 that is determined as a non-defective product after an inspection process (the inspection process is not shown) becomes embedded capacitor unit 400 shown in FIG. 6B.

FIG. 6B is a sectional view, as an example, of embedded capacitor unit 400. As shown in FIG. 6B, embedded capacitor unit 400 has at least heat-resistant metal plate 130, and embedded capacitor part 190 including sintered dielectric 160 and upper electrode 170 that are formed on one or more surfaces of heat-resistant metal plate 130. Embedded capacitor unit 400 can be manufactured by dividing and disconnecting multiple unit 330 described with reference to FIG. 6A into a predetermined shape using a dicing device or the like.

Depending on needs, it is useful to provide, at a part of upper electrode 170, upper auxiliary electrode 180 having a thickness of 5 μm or above for wire bonding.

It is also useful to provide lower electrode 140 between heat-resistant metal plate 130 and sintered dielectric 160. Further, it is also useful to provide lower electrode 140 between heat-resistant metal plate 130 and sintered dielectric 160, and further provide lower auxiliary electrode 150 having a thickness of 5 μm or above, more preferably 10 μm or above, in superposition with lower electrode 140 at a portion exposed to the outside from sintered dielectric 160. This lower auxiliary electrode 150 can be used as an electrode having a thickness of 5 μm or above for wire bonding.

A metal member used for heat-resistant metal plate 130 preferably contains aluminum (A) by 0.5 wt % or more. By using heat-resistant metal plate 130 containing aluminum by 0.5 wt % or more, oxidation and degradation of heat-resistant metal plate 130 at a sintering time of sintered dielectric 160 can be prevented. When a metal member is heated, an aluminum component contained in heat-resistant metal plate 130 is dispersed to a surface of heat-resistant metal plate 130 and is oxidized to become a strong oxide film like $Al_2O_3$. Therefore, the aluminum component prevents oxidation and degradation of a metal member body. Further, the oxide film such as $Al_2O_3$ formed on the surface of heat-resistant metal plate 130 functions as an adhesion component to lower electrode 140 or lower auxiliary electrode 150. Therefore, adhesion strength between heat-resistant metal plate 130 and lower electrode 140 or lower auxiliary electrode 150 can be enhanced. When the content of aluminum contained in heat-resistant metal plate 130 becomes more than 20 wt %, heat-resistant metal plate 130 becomes special and expensive. Therefore, the content of aluminum is preferably 20 wt % or less.

In sintered dielectric 160, it is preferable to use a sintered dielectric member formed by sintering not containing a lead component or a glass component. By using sintered dielectric 160 not containing a lead component, environment measure becomes possible. When sintered dielectric 160 contains a glass component, a dielectric constant (e) of sintered dielectric 160 becomes low, and a capacitance value as a capacitor becomes low, affecting reliability in some cases. In order to form sintered dielectric 160 by using a dielectric member not containing a glass component or a lead component, a dielectric material (or dielectric paste) provided by using BTO or the like as a main raw material and by adding a necessary inorganic additive may be fired at 850° C. to 950° C.

Next, a structure and a material of embedded capacitor unit 400 will be described with reference to FIG. 7.

Figure 7:
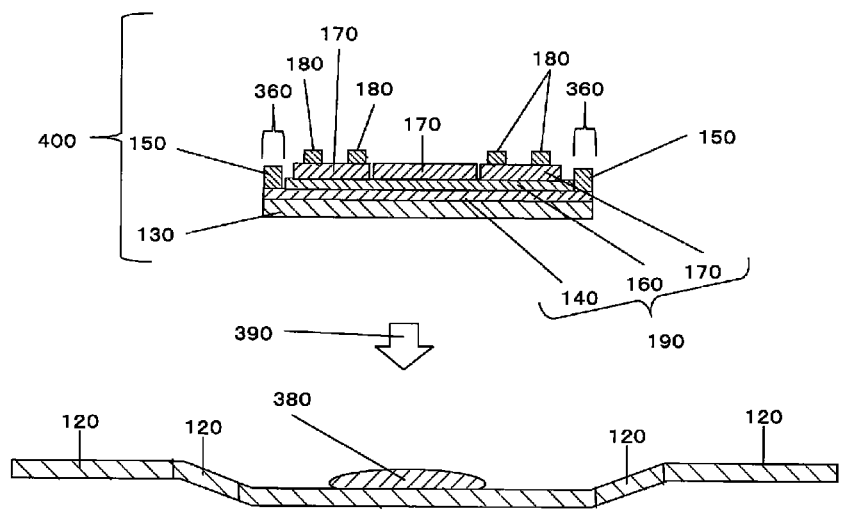

As shown in FIG. 7, embedded capacitor unit 400 is formed of sintered dielectric 160, lower electrode 140, and upper electrode 170 that are individually or collectively fired at 850° C. to 950° C. Desirably, an external shape of or a projection drawing from above embedded capacitor unit 400 is a simple shape such as a rectangle and a square. By setting an external shape of embedded capacitor unit 400 in a rectangle or a square, deformation of embedded capacitor part 190 can be prevented in the heat treatment process at 850° C. to 950° C. In this way, the external shape of embedded capacitor unit 400 is set in a simple external shape such as a rectangle and a square not having a fine pattern portion like a general lead frame. By setting a simple external shape in this way, there is no risk of deformation and missing of a fine pattern portion at the heat treatment time. In order to configure embedded capacitor part 190, collective firing may be performed after printing a paste material.

Further, by setting heat-resistant metal plate 130 to function as a kind of constrained layer, a dielectric at a sintering time can be sintered in not an XY direction but in a substantially Z-axis direction (in FIG. 7, the X axis indicates a lateral direction, the Y axis indicates a depth, and the Z axis indicates a vertical direction). As a result, a pattern shape of sintered dielectric 160 or upper electrode 170 does not change from a printing time to after sintering, and can maintain high dimensional accuracy.

The thickness of sintered dielectric 160 to be used in embedded capacitor unit 400 is preferably 3 μm or above and 50 μm or below, more preferably, 5 μm or above and 30 μm or below, and even more preferably, 7 μm or above and 20 μm or below. When the thickness is less than 3 μm, insulation reliability of sintered dielectric 160 may have a problem. When the thickness exceeds 50 μm, capacitance density may become low.

The thickness of heat-resistant metal plate 130 to be used in embedded capacitor unit 400 is preferably 50 μm or above and 300 μm or below, more preferably, 100 μm or above and 200 μm or below, and even more preferably, 150 μm or below. When the thickness is less than 50 μm, rigidity of heat-resistant metal plate 130 becomes low. At a handling time, mountability after dividing the capacity unit into pieces or shape stability at this time becomes low. As a result, sintered dielectric 160 is peeled off at a firing time, and a problem occurs in insulation performance in some cases. When the thickness of sintered dielectric 160 exceeds 300 μm, this affects the thickness of semiconductor device 110.

It is useful to set a size (or a projection floor area) of embedded capacitor unit 400 or single unit 340 to an area of 1 mm×1 mm or above to 30 mm×30 mm or below. When the size of embedded capacitor unit 400 or single unit 340 is smaller than 1 mm×1 mm, handling becomes difficult, and a shape of semiconductor chip 270 fixed onto embedded capacitor unit 400 is limited in some cases. When the size of embedded capacitor unit 400 or single unit 340 becomes larger than 30 mm×30 mm, planarity (or coplanarity) required at a mounting time of embedded capacitor unit 400 becomes low in some cases.

Third Exemplary Embodiment

In a third exemplary embodiment, a method of manufacturing semiconductor device 110 using the embedded capacitor unit described in the second exemplary embodiment will be described with reference to FIG. 7 to FIG. 14.

FIG. 7 shows a state in which the embedded capacitor unit is mounted on a lead frame by using a conductive adhesive agent and the like.

In FIG. 7, reference numeral 380 denotes a conductive adhesive agent. As conductive adhesive agent 380, there is used commercially available die-attach conductive Ag paste (containing a resin), adhesive agent or a die attach film. A reference numeral 390 denotes an arrow, and reference numeral 400 denotes a embedded capacitor unit. The embedded capacitor unit 400 is single unit 340 obtained by individually separating from multiple unit 330. As embedded capacitor unit 400, only single units determined as non-defective products are selected for use, excluding single unit 340 which becomes a defective product as a result of various property inspections.

As shown in FIG. 7, conductive adhesive agent 380 is applied to a part of lead frame 120. On conductive adhesive agent 380, embedded capacitor unit 400 is mounted as indicated by arrow 390. Conductive adhesive agent 380 fixes embedded capacitor unit 400 onto lead frame 120, as conductive adhesive part 300. Depending on needs, the conductive adhesive agent may be applied to a plurality of sites.

Arrow 390 in FIG. 7 indicates a state of mounting embedded capacitor unit 400 on lead frame 120. As indicated by arrow 390 in FIG. 7, embedded capacitor unit 400 determined as a non-defective product by inspection and the like is mounted on lead frame 120 applied with conductive adhesive agent 380. Thereafter, as shown in FIG. 8, semiconductor chip 270 is mounted.

Figure 8:
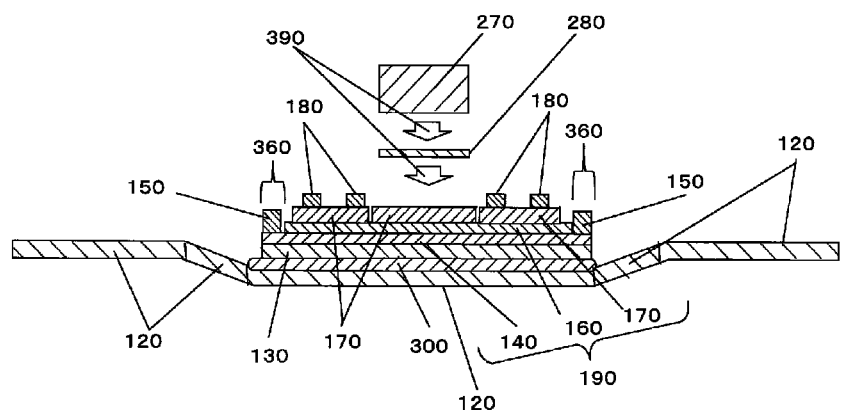
FIG. 8 shows a state in which a semiconductor chip is fixed on the embedded capacitor unit.

FIG. 8 shows a state in which a semiconductor chip is fixed on the embedded capacitor unit. As shown in FIG. 8, embedded capacitor unit 400 is fixed on lead frame 120 with conductive adhesive part 300 interposed therebetween. Arrow 390 in FIG. 8 indicates a state of fixing semiconductor chip 270 on embedded capacitor unit 400, via die attach part 280 composed of an adhesive agent or an adhesive sheet. As shown in FIG. 8, lead frame 120 is an extraction of only a portion of single unit 340 among all of lead frames formed in a multiple unit shape (not shown) on the left and right sides of this lead frame.

Figure 9:
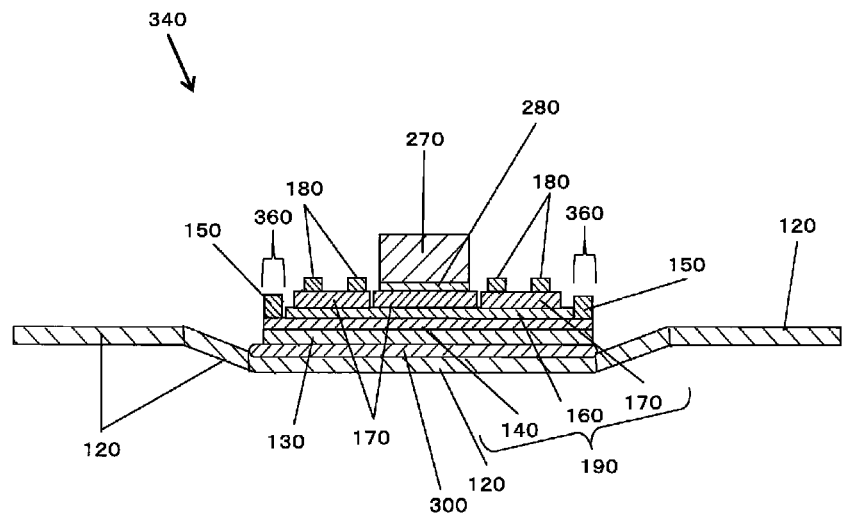
FIG. 9 shows a state in which a semiconductor chip is fixed on the embedded capacitor unit with a die attach part interposed therebetween.

FIG. 9 shows a state in which a semiconductor chip is connected to the embedded capacitor unit electrically and mechanically with a die attach part interposed therebetween.

Die attach part 280 may be bonded when semiconductor chip 270 is in a wafer condition. By integrating semiconductor chip 270 with die attach part 280 beforehand, die attach part 280 can be also divided into pieces at the time of dicing semiconductor chip 270 into pieces. In this way, die attach part 280 composed of a die attach film or the like may be mounted on embedded capacitor part 190 as shown in FIG. 8, in a condition that die attach part 280 is bonded in advance to semiconductor chip 270. With this arrangement, as die attach part 280, there can be used a commercially available thin die attach part having a thickness of about 10 µm.

It is also useful to perform capacitance inspection and various electric inspections of dielectric characteristics, insulation performance, and the like, again in a condition immediately before performing this wire bonding, and at a time point of completion of a die bonding process.

Next, a wire bonding process will be described with reference to FIG. 10 to FIG. 14.

Figure 10:
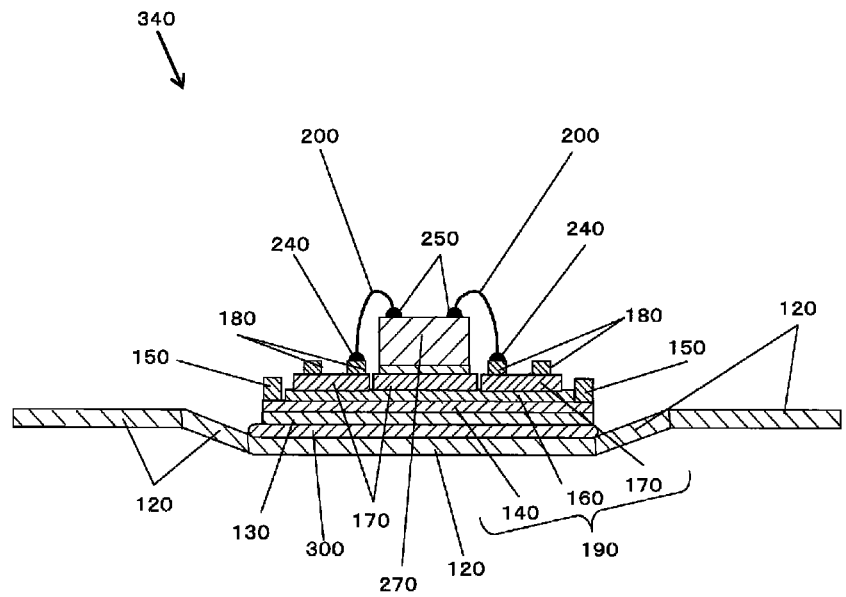
FIG. 10 shows a state in which the semiconductor chip and the upper electrode are connected with each other via wires.

FIG. 10 shows a state in which the semiconductor chip and the upper electrode are connected with each other via wires. As shown in FIG. 10, semiconductor chip 270 and upper electrode 170 or upper auxiliary electrode 180 are connected with each other, via first wire 200. In this case, it is useful to form electrode bonding part 240 between first wire 200 and upper electrode 170 and between first wire 200 and upper auxiliary electrode 180. It is also useful to form semiconductor bonding part 250 on a connection part between semiconductor chip 270 and first wire 200.

In FIG. 10, semiconductor bonding part 250 provided on semiconductor chip 270 and upper auxiliary electrode 180 provided on embedded capacitor part 190 are connected with each other by first wire 200 formed by a short wire.

Figure 11:
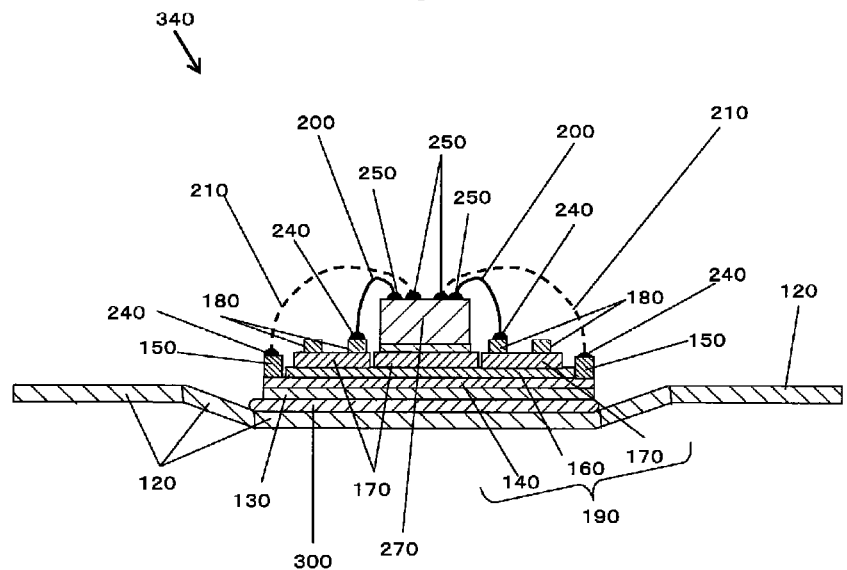
FIG. 11 shows a state in which the semiconductor chip and the lower electrode are connected with each other via wires.

FIG. 11 shows a state in which the semiconductor chip and the lower electrode are connected with each other via wires. As shown in FIG. 11, semiconductor chip 270 and lower electrode 140 or lower auxiliary electrode 150 are connected with each other, via second wire 210. Via second wire 210 (not shown), semiconductor chip 270 and lower electrode 140 may be connected with each other and semiconductor chip 270 and heat-resistant metal plate 130 may be connected with each other. It is useful to form electrode bonding part 240 on lower electrode 140, lower auxiliary electrode 150, and heat-resistant metal plate 130, and to connect first wire 200 and second wire 210 to electrode bonding part 240. It is also useful to form semiconductor bonding part 250 on a connection part between semiconductor chip 270 and second wire 210.

Figure 12:
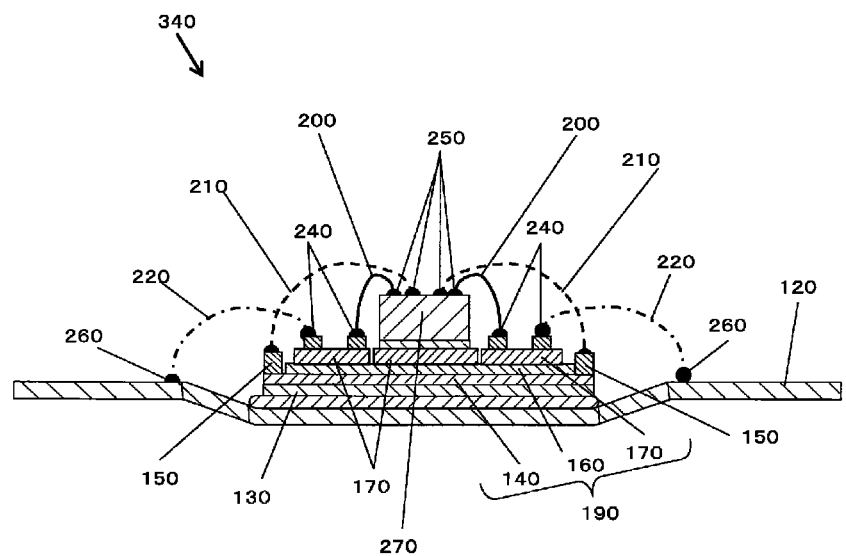
FIG. 12 shows a state in which the lower electrode and the lead frame are connected with each other via wires.

FIG. 12 shows a state in which the upper electrode and the lead frame are connected with each other via wires. As shown in FIG. 12, upper electrode 170 and lead frame 120 are connected with each other via third wire 220. Instead of upper electrode 170, upper auxiliary electrode 180 and lead frame 120 may be connected with each other via third wire 220 (not shown). In this case, it is also useful to form LF bonding part 260 on a connection part between lead frame 120 and third wire 220. It is useful to form electrode bonding part 240 between lower electrode 140 and third wire 220, between lower auxiliary electrode 150 and third wire 220, and between heat-resistant metal plate 130 and third wire 220.

As described above, by providing electrode bonding part 240, semiconductor bonding part 250, and LF bonding part 260, connection stability between the wire and each member can be enhanced.

Figure 13:
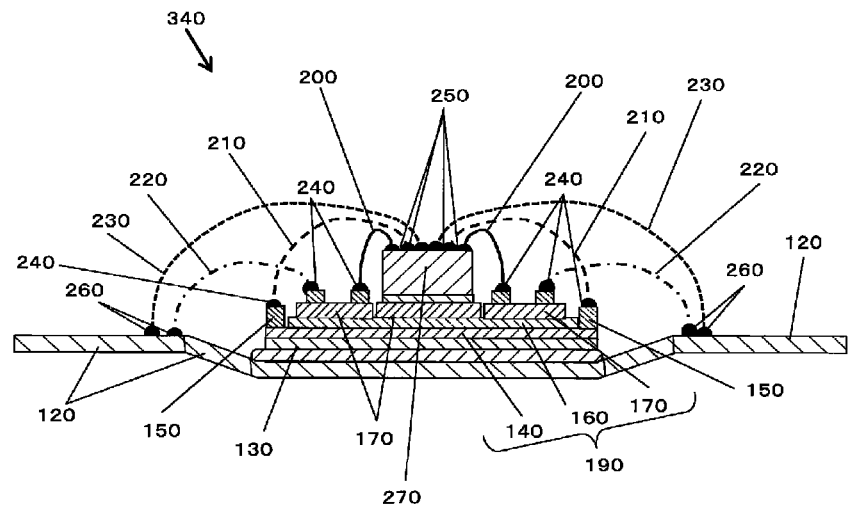
FIG. 13 shows a state in which the semiconductor chip and the lead frame are connected with each other via wires.

FIG. 13 shows a state in which the semiconductor chip and the lead frame are connected with each other via wires. As shown in FIG. 13, semiconductor chip 270 and lead frame 120 are connected with each other via fourth wire 230. It is also useful to use fourth wire 230 as a long wire.

The order of the wire connection process described with reference to FIG. 10 to FIG. 13 does not need to be limited to the sequence of FIG. 10 to FIG. 13. According to specifications of semiconductor chip 270 and number of pins of lead frame 120, the process shown in FIG. 10 to FIG. 13 may be appropriately replaced.

Figure 14:
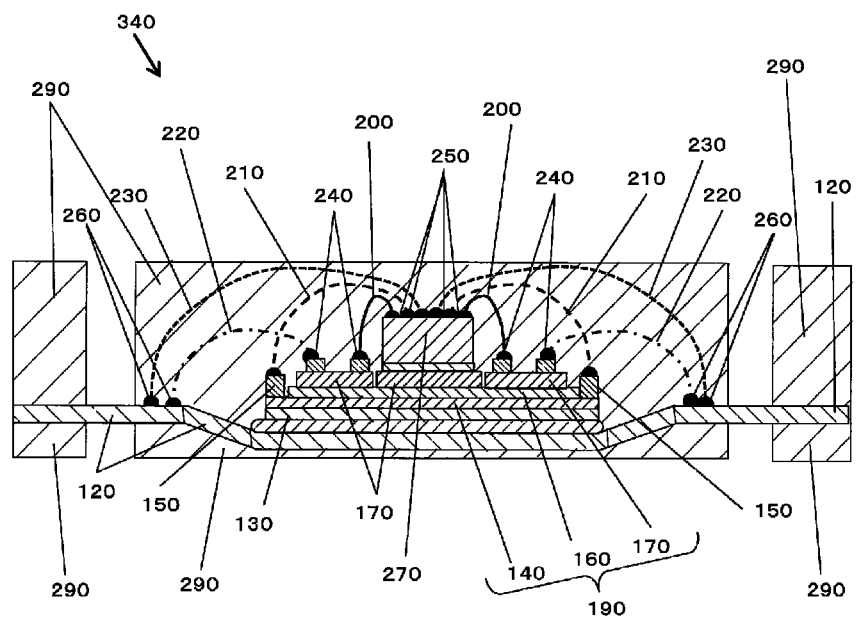
FIG. 14 shows a state of molding by using a commercially available mold resin, after ending bonding.

FIG. 14 shows a state of molding using a mold in a predetermined shape by using a commercially available mold resin, after ending bonding. As shown in FIG. 14, semiconductor chip 270, first wire 200, second wire 210, third wire 220, fourth wire 230, and embedded capacitor unit 400 are covered with mold part 290 as a mold resin, so that handling and reliability of semiconductor device 110 can be enhanced. In a resin sealing process, it is important to avoid occurrence of an electrical short circuit between the wires due to flow of a bonding wire. By forming lower auxiliary electrode 150 and upper auxiliary electrode 180, bonding pull strength becomes high and stability of a bonding wire shape improves. Mold part 290 may not be a resin, as far as the mold part 290 covers semiconductor device 110 by insulating from the outside of the semiconductor device.

Thereafter, a lead bending process is performed in a predetermined shape. Further, mold part 290 and the like that enter a die pad back surface of lead frame 120 and become unnecessary portions are removed. As a result, semiconductor device 110 shown in FIG. 1 is obtained. By removing mold part 290 in this way, a bottom part of lead frame 120 mounted with embedded capacitor part 190 can be exposed to the outside.

In FIG. 6A and FIG. 6B, a mold resin and the like that become an exterior are not provided in embedded capacitor unit 400. This is because a mold resin that becomes an exterior of semiconductor chip 270 can be shared as shown in FIG. 14.

In FIG. 7 to FIG. 14, a semiconductor device is shown in a condition of individual single unit 340. However, multiple unit 330 may be manufactured as shown in FIG. 3A to FIG. 6B and be divided into single units 340 last.

Fourth Exemplary Embodiment

With reference to a fourth exemplary embodiment, a problem that occurs when a dielectric is formed on a lead frame will be described as a comparative example. In the fourth exemplary embodiment, there will be described, with reference to FIG. 15 to FIG. 17, a case of providing a dielectric on a heat-resistant metal plate as described in the present disclosure and a case of forming a dielectric directly on a lead frame as the comparative example.

Figure 15:
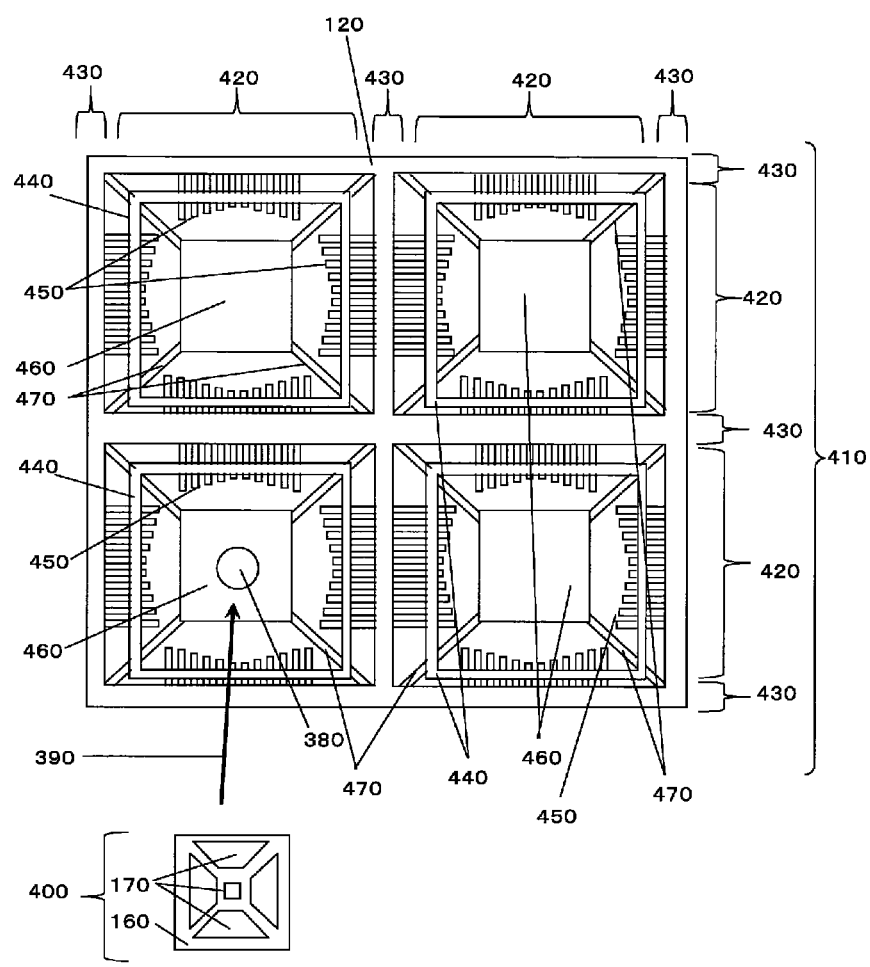
FIG. 15 is a plan view of a lead frame to be used in the semiconductor device described by the inventors of the present disclosure in the exemplary embodiments.

FIG. 15 is a plan view, as an example, of a lead frame to be used in the semiconductor device described by the inventors of the present disclosure in the exemplary embodiments. In FIG. 15, reference numeral 410 denotes a multiple lead frame, reference numeral 420 denotes a product part, and reference numeral 430 denotes a frame part. Frame part 430 corresponds to a connection portion for maintaining regularly, in the Y direction and the X direction as multiple lead frame 410, a plurality of product parts 420 for mounting semiconductor chip 270 (not shown) and embedded capacitor unit 400, for example (in FIG. 15, the X axis indicates a lateral direction, the Y axis indicates a vertical direction.) Reference numeral 440 denotes a polyimide reinforcing member, and reference numeral 450 denotes a terminal part. Polyimide reinforcing member 440 prevents occurrence of distortion, deformation, and warpage of terminal part 450 of lead frame 120 in product part 420 having a fine complex shape. Polyimide is used as a material of polyimide reinforcing member 440. Reference numeral 460 denotes a center part, and reference numeral 470 denotes a center holding part. Center holding part 470 is a portion that holds center part 460. In semiconductor device 110 according to the present disclosure, embedded capacitor unit 400 is fixed on center part 460 by using conductive adhesive agent 380 or the like, as indicated by arrow 390.

Lead frame 120 shown in FIG. 15 is obtained by patterning a piece of metal plate by machining into terminal part 450, center part 460, center holding part 470, product part 420, and frame part 430. Terminal part 450 (or an end part) of lead frame 120 is very fine and is formed in high precision to meet particularly wire bonding. In order to keep in high precision a position and a shape of terminal part 450, forming polyimide reinforcing member 440 is preferable.

As a comparative example of the present disclosure, there will be described a case of firing and sintering, on center part 460 of lead frame 120, a sinterable dielectric (not shown), in a predetermined pattern in a paste shape by screen printing or the like. The comparative example corresponds to the case of firing and sintering a sinterable dielectric (not shown) onto center part 460 of lead frame 120, in a predetermined pattern in a paste shape by screen printing or the like, as shown in FIG. 15.

Figure 16:
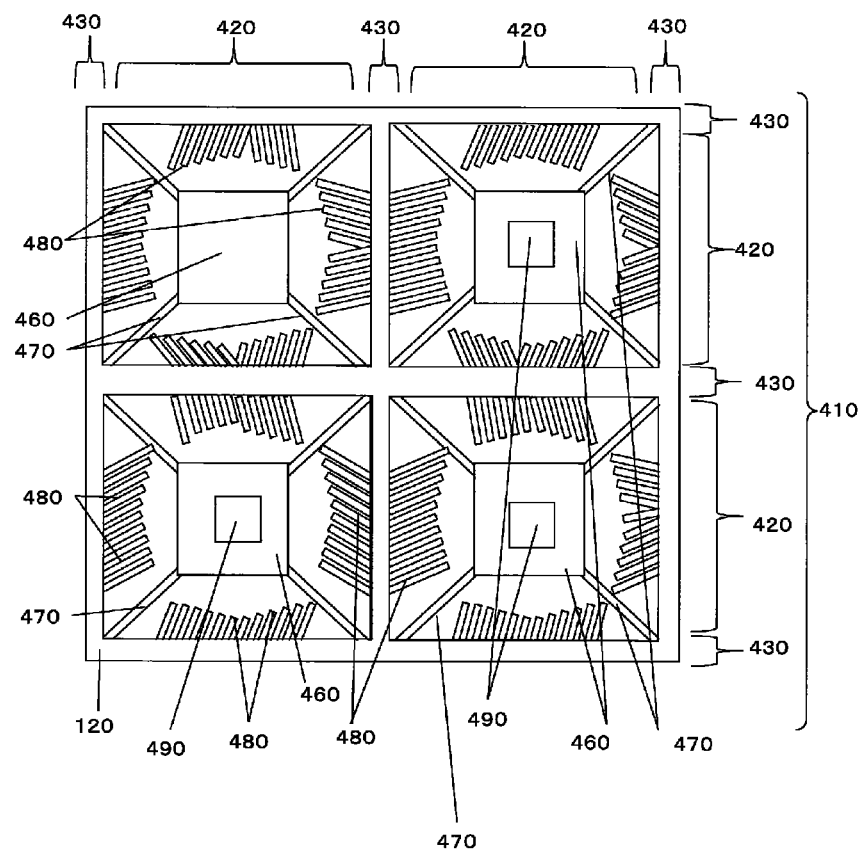
FIG. 16 is a plan view of the lead frame showing a problem that occurs when heat treatment (at about 400° C., for example) is performed after a dielectric material for a capacitor is formed by printing onto a center holding part shown in FIG. 15.

FIG. 16 is a plan view showing a problem of the comparative example. FIG. 16 is a plan view, as an example, showing a problem that occurs when heat treatment (at 400° C. to 600° C., for example) is performed after a dielectric material for a capacitor is formed by printing onto the center holding part shown in FIG. 15, for example.

In FIG. 16, reference numeral 480 denotes a deformed part, and reference numeral 490 denotes a comparative-product dielectric part. Comparative-product dielectric part 490 corresponds to a dielectric material of a paste condition printed onto center holding part 470 and heat treated at about 400° C. to 600° C., for a capacitor. The heat treatment at 400° C. to 600° C. corresponds to a condition that a binder component (an organic component) disappears from a dielectric paste but a sintering of a dielectric powder does not start yet.

Even in the case of lead frame 120 reinforced with polyimide reinforcing member 440 described with reference to FIG. 15, deformed part 480 occurs as shown in FIG. 16 when lead frame 120 is heated at 400° C. to 600° C. Deformed part 480 is lead frame 120 a part of which is deformed as a result of resolution and disappearance of polyimide reinforcing member 440 by heating.

Comparative-product dielectric part 490 in FIG. 16 is not sintered yet. This is because, in some cases, contraction of a firing-type dielectric material by sintering is not started yet at 400° C. to 600° C.

As shown in FIG. 16, even when lead frame 120 is formed with polyimide reinforcing member 440, lead frame 120 is deformed as shown in FIG. 16 when heat treated at or above heat resistance temperature of polyimide reinforcing member 440 (for example, 400° C. or above). Once the lead frame is deformed, it is extremely difficult to recover the lead frame from this deformation to a high precision condition. Needless to mention, electrical connection by wire bonding is difficult.

Figure 17:
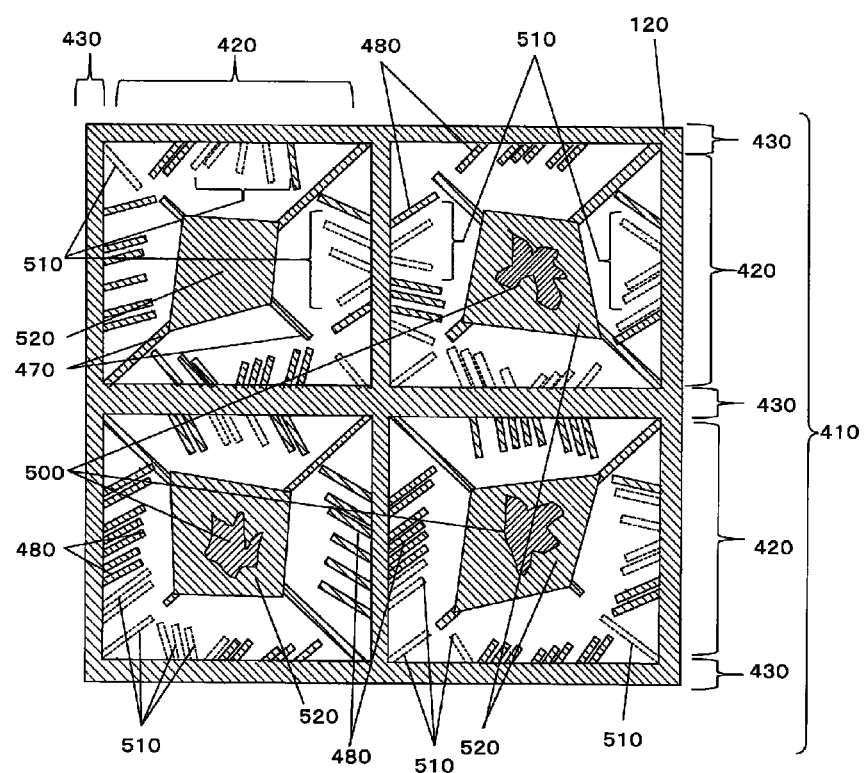
FIG. 17 is a sectional view of the lead frame showing a problem that occurs when heat treatment at 850° C. to 950° C. necessary for dielectric firing is performed on the lead frame.

FIG. 17 shows a problem that occurs when heat treatment at 850° C. to 950° C. necessary for dielectric firing is performed on the lead frame. FIG. 17 shows a multiple lead frame that is heat treated at about 850° C. to 950° C. after a dielectric material for a capacitor is formed at room temperature (for example, 20° C. to 25° C.) on center holding part 470 of lead frame 120 formed with polyimide reinforcing member 440 in FIG. 15 and FIG. 16.

In FIG. 17, reference numeral 500 denotes a deformed sintered-dielectric part, reference numeral 510 denotes a missing part, and reference numeral 520 denotes a deformed center part.

As shown in FIG. 17, in lead frame 120 heat treated at 850° C. to 950° C., missing part 510 (missing part 510 is indicated by a dotted line) occurs in addition to deformed part 480. Missing part 510 is a deformed and missed portion of a fine portion of lead frame 120 for which high precision is required. Further, center part 460 also becomes deformed center part 520 in some cases. This is because a part of center holding part 470 is missed and deformed. When center part 460 becomes deformed center part 520 as a result of deformation, comparative-product dielectric part 490 shown in FIG. 16 becomes deformed sintered-dielectric part 500 shown in FIG. 17. This is because the dielectric is also deformed following the deformation of center part 460 holding the dielectric part. Further, the dielectric material contracts when sintered by heat treatment at 850° C. to 950° C. Therefore, the dielectric material becomes deformed sintered-dielectric part 500 due to further deformation of the dielectric.

As shown in FIG. 17, when a part of lead frame 120 is deformed and position precision of lead frame 120 becomes low, lead frame 120 becomes difficult to meet wire bonding. When the dielectric part becomes deformed sintered-dielectric part 500, cracks, microcracks, and short circuits easily occur in the dielectric itself. As a result, electric characteristics and reliability of the dielectric part become low.

On the other hand, in the case of the present disclosure, even when the dielectric is sintered to provide sintered dielectric 160, lead frame 120 is not deformed. This is because, in the case of the present disclosure, the dielectric is fired as sintered dielectric 160 on the heat-resistant metal plate provided separately from lead frame 120. That is, in the case of semiconductor device 110 according to the present disclosure, heat-resistant metal plate 130 on which sintered dielectric 160 and the like are formed receives the influence of heat treatment. Lead frame 120 itself does not receive the influence of heat treatment at the dielectric formation time Therefore, in semiconductor device 110 according to the present disclosure, polyimide reinforcing member 440 for holding high precision of lead frame 120 can be contained in a molded component using a mold resin, in a condition that polyimide reinforcing member 440 is fixed on lead frame 120, as shown in FIG. 14.

Fifth Exemplary Embodiment

By using a fifth exemplary embodiment, the inventors of the present disclosure will summarize results of FIG. 15 to FIG. 17 in the following Table 1 and Table 2. Table 1 summarizes a condition of a dielectric after a heat treatment, and Table 2 summarizes problems of a lead frame (LF) that occur at a firing time of the dielectric. Present disclosure product is the present disclosure product described with reference to FIG. 1 to FIG. 14. Comparative product is the comparative product described with reference to FIG. 16 and FIG. 17.

[Table 1] Description of Condition of Dielectric after Heat Treatment

TABLE 1

|  | Present disclosure product | Comparative product |
|---|---|---|
| Presence/absence of crack of dielectric | Good (no crack) | Poor (crack occurred) |
| Presence/absence of peeling off of dielectric | Good (no peeling off) | Poor (peeling off occurred) |

TABLE 1-continued

|  | Present disclosure product | Comparative product |
|---|---|---|
| Good/poor of capacitor characteristics | Good (function as capacitor) | Poor (not function as capacitor) |

Presence/absence of crack of dielectric in Table 1 shows an appearance condition of a dielectric formed by firing at 850° C. to 950° C. in the case of the present disclosure product and the comparative product. In the case of the present disclosure product, neither crack nor peeling off occurred (both Good; non-defective product). A capacitor produced using this dielectric showed predetermined characteristics of a capacitor.

On the other hand, in the case of the comparative product, crack, deformation, and peeling off occurred in the dielectric, as shown in FIG. 17. A capacitor produced using the dielectric in which crack, deformation, and peeling off occurred did not function as a capacitor.

[Table 2] Problem of Lead Frame (LF) that Occurs at Firing Time of Dielectric

TABLE 2

|  | Present disclosure product | Comparative product |
|---|---|---|
| Presence/absence of deformation of LF | Good (no deformation) | Poor (deformation occurred) |
| Presence/absence of missing of LF | Good (no missing) | Poor (missing occurred) |
| Wire bonding properties to LF | Good (no problem) | Poor (wire bonding not possible) |

As shown in Table 2, in the present disclosure product, neither deformation nor missing occurs in the LF (lead frame) at the firing time of the dielectric. This is because the dielectric is fired on the heat-resistant metal plate different from the lead frame and lead frame 120 is not subjected to heat treatment at 850° C. to 950° C. As a result, the LF of the present disclosure had also excellent wire bonding characteristics to lead frame 120. This is partly because wire bonding described with reference to FIG. 10 to FIG. 13 can be performed on the present disclosure product in a condition that polyimide reinforcing member 440 is formed as described with reference to FIG. 15 (polyimide reinforcing member 440 is not shown in FIG. 10 to FIG. 13, and FIG. 1). As described above, in the case of the present disclosure product, the dielectric material is fired on separately provided heat-resistant metal plate 130. Therefore, wire bonding can be performed in a condition that polyimide reinforcing member 440 is formed on lead frame 120 according to the present disclosure.

On the other hand, in the case of the comparative product, lead frame 120 was deformed, and further, a part of lead frame 120 was missed. This is considered partly because polyimide reinforcing member 440 disappeared when the dielectric formed on lead frame 120 was fired at 850° C. to 950° C., or because lead frame 120 is easily deformed when firing and heat treatment is performed after removing polyimide reinforcing member 440. Needless to mention, wire bonding was not performed on lead frame 120 having deformation or a missing portion like the comparative product.

As described above, according to the present disclosure, sintered dielectric 160 for forming a decoupling capacitor is formed on heat-resistant metal plate 130 provided separately from lead frame 120. Therefore, lead frame 120 is not deformed or missed. As a result, the present disclosure can satisfy a required condition of a lead frame package that is excellent in wire bonding properties and meets a multi-pin.

Sixth Exemplary Embodiment

In a sixth exemplary embodiment, a semiconductor package using a semiconductor device according to the present disclosure will be described.

Figure 18A:
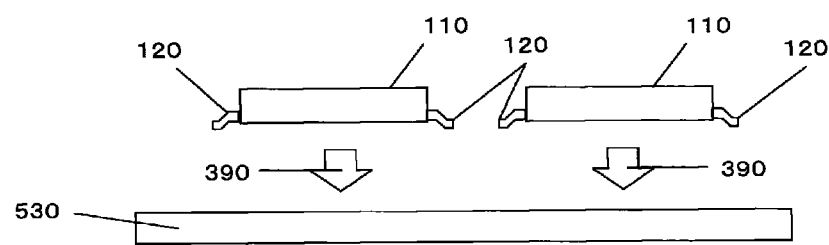
FIG. 18A is a side view of a semiconductor package using the semiconductor device according to the present disclosure.
Figure 18B:
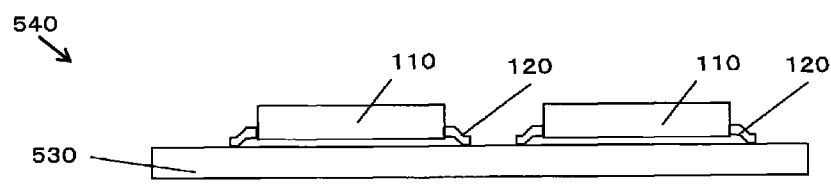
FIG. 18B is a side view of the semiconductor package using the semiconductor device according to the present disclosure.
Figure 18C:
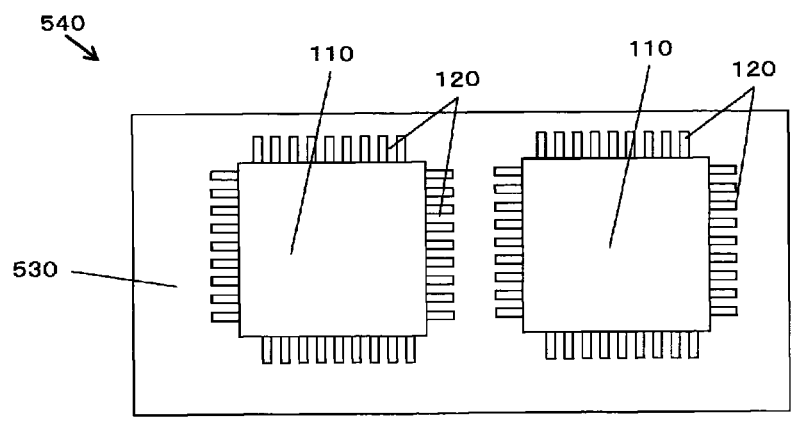
FIG. 18C is a top view of the semiconductor package using the semiconductor device according to the present disclosure.

FIG. 18A to FIG. 18C are side views and an upper surface view, respectively, of a semiconductor package using a semiconductor device according to the present disclosure.

In FIG. 18A to FIG. 18C, reference numeral 530 denotes a wiring board, and reference numeral 540 denotes a semiconductor package. As wiring board 530, a commercially available multilayer glass-epoxy-resin board can be used. Semiconductor device 110 shown in FIG. 18A to FIG. 18C is semiconductor device 110 according to the present disclosure described in the first exemplary embodiment. In FIG. 1, embedded capacitor unit 400 contained in semiconductor device 110, and polyimide reinforcing member 440 for holding position precision of lead frame 120 are not shown.

Arrow 390 in FIG. 18A indicates a state of mounting semiconductor device 110 according to the present disclosure on wiring board 530. Solder and the like for mounting lead frame 120 extended from semiconductor device 110 onto wiring board 530 are not shown.

FIG. 18B corresponds to a side view of a semiconductor package having a semiconductor device and a wiring board. In FIG. 18B, other semiconductors and other chip parts are not shown.

FIG. 18C corresponds to a top view of a semiconductor package having a semiconductor device and a wiring board. In FIG. 18C, other semiconductors and other chip parts are not shown.

As shown in FIG. 18B and FIG. 18C, semiconductor package 540 according to the present disclosure has at least wiring board 530, and semiconductor device 110 mounted on wiring board 530.

By using semiconductor device 110 according to the present disclosure and semiconductor package 540 using semiconductor device 110, it is possible to achieve further high resolution of various on-vehicle displays, portable terminals, and high-definition displays excellent in high-speed transmission quality. Because embedded capacitor unit 400 contained in semiconductor device 110 according to the present disclosure can supply charges with excellent transient response, power supply quality at the high speed operation time can be enhanced. As a result, jitter is substantially reduced in the signal circuit of the semiconductor chip.

Further, by using a lead frame package excellent in vibration resistance not only in productivity and cost competitiveness, high-speed transmission quality can be enhanced. Therefore, it is possible to provide devices extremely suitable in an on-vehicle field in which high-speed image processing is increasingly required in future. Further, it is also possible to provide devices with improved noise resistance capable of suppressing swing of a power-supply voltage against noise from the outside.

Seventh Exemplary Embodiment

In a seventh exemplary embodiment, inventors' evaluation results of high-speed transmission quality of a semiconductor device according to the present disclosure and a semiconductor package according to the present disclosure will be described with reference to Table 3 and Table 4.

Table 3 is an example of evaluation results of jitter reduction effect in semiconductor device 110 including a conventional example and comparative examples of trial production by the inventors of the present disclosure.

Table 3 is for comparing and contrasting structures between a conventional example (not containing a capacitor), Comparative Example 1 (only a part of the present disclosure is executed), Comparative Example 2 (instead of sintered dielectric 160, a conventional non-sintered resin-containing dielectric is used), and examples (Examples 1 to 4) of the present disclosure.

In Table 3, conventional example is a QFP (Quad Flat Package) package configuration not provided with embedded capacitor unit 400 (that is, capacitance density is 0).

Figure 19:
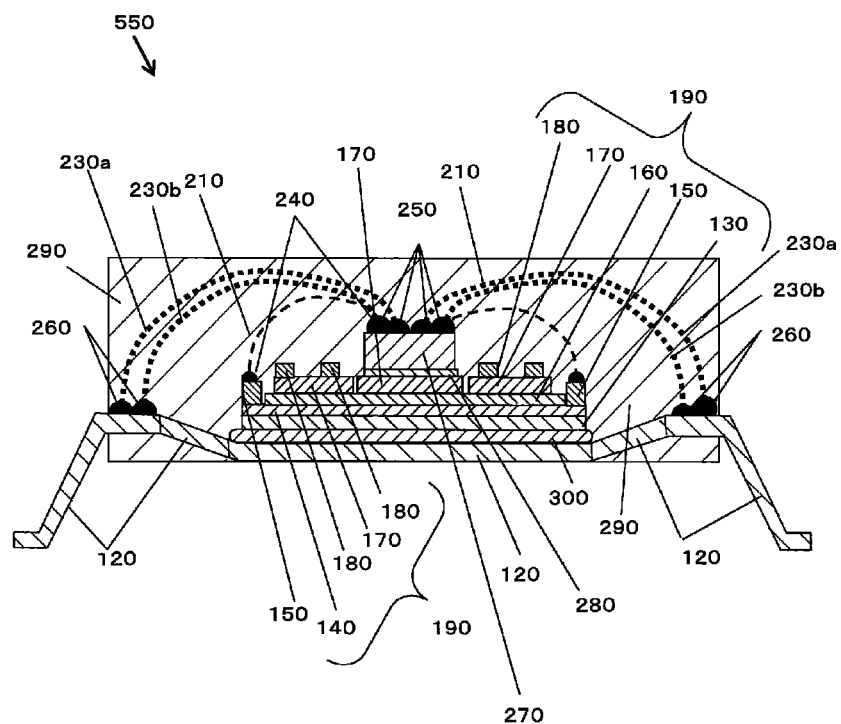
FIG. 19 is a sectional view of a configuration of Comparative Example 1 in Table 3.
Figure 20:
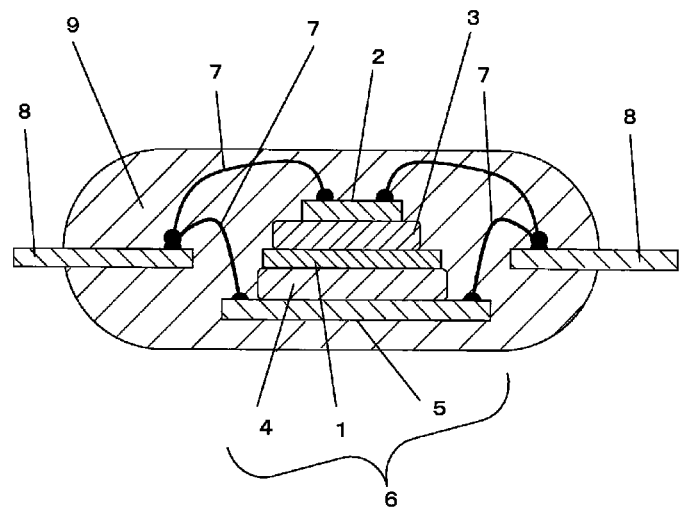
FIG. 20 is a sectional view of a conventional semiconductor package containing a laminated capacitor using an insulation film and metal foil.
Figure 21:
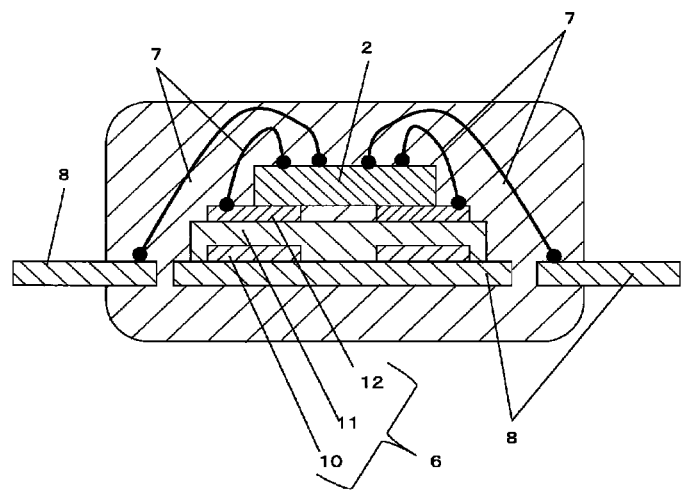
FIG. 21 is a sectional view of a conventional semiconductor package containing a capacitor having a dielectric formed on a lead frame.

FIG. 19 is a sectional view of a configuration of Comparative Example 1 in Table 3. In FIG. 19, reference numeral 550 denotes a comparative product. As shown in FIG. 19, comparative product 550 corresponds to Comparative Example 1 in Table 3. By connecting semiconductor chip 270 and lead frame 120 with each other via a plurality of fourth wires 230a, 230b, ESR (equivalent series resistance) and the like were upgraded.

Comparative Example 1 in Table 3 is a sample that contains embedded capacitor unit 400. However, semiconductor chip 270 and embedded capacitor unit 400 are connected with each other via only second wire 210. That is, in the structure of Comparative Example 1, upper electrode 170 or upper auxiliary electrode 180 and semiconductor chip 270 that configure embedded capacitor unit 400 are not electrically connected with each other (no capacitor is connected to semiconductor chip 270, that is, capacitance density is 0). Embedded capacitor unit 400 in Comparative Example 1 uses stainless foil containing Al (aluminum) and having a thickness of 100 μm. As described above, Comparative Example 1 is upgrading of ESR (equivalent series resistance) by connecting semiconductor chip 270 and lead frame 120 with each other via a plurality of fourth wires 230a, 230b, as shown in FIG. 19.

Comparative Example 2 in Table 3 is a combination of dielectric paste (k=30), provided by having BTO powder dispersed in an epoxy resin, and copper foil having a thickness of 18 μm, as a dielectric material configuring a embedded capacitor unit, (not shown). In the case of Comparative Example 2, capacitance density was low at 7 pF/mm². The sample is the same as a product containing a capacitor of capacitance 0.17 nF, and the low capacitance density is considered because of a low dielectric constant of the dielectric paste. The sample of Comparative Example 2 had low capacitance density, and was Poor (undesirable result).

Example 1 in Table 3 is a sample containing BTO (K=500) as a dielectric material. In Example 1, stainless foil (thickness 50 μm) containing aluminum was used as heat-resistant metal plate 130. In Example 1, lower electrode 140 and upper electrode 170 are AgPd electrodes, and lower auxiliary electrode 150 and upper auxiliary electrode 180 are not provided. As a result, in Example 1, a high capacitance density of 400 pF/mm² was obtained in embedded capacitor unit 400. However, embedded capacitor unit 400 of trial production had 2 non-defective products and 3 NG products in parameter n=5. The NG products had short circuits in the electric inspection of a capacitor. It is clear from the above that at a small thickness of 50 μm of heat-resistant metal plate 130, bearing force of the heat-resistant metal plate becomes low when lower auxiliary electrode 150 or upper auxiliary electrode 180 is not provided. Due to force and heat generated at the wire bonding time, microcracks occur in sintered dielectric 160 in some cases.

Example 2 in Table 3 is a sample including sintered dielectric 160 containing BTO (K=500) as a dielectric material. In Example 2, stainless foil (thickness 50 μm) containing aluminum is used as heat-resistant metal plate 130. In Example 2, lower electrode 140 and upper electrode 170 are AgPd electrodes. Further, Ag electrodes are provided as lower auxiliary electrode 150 and upper auxiliary electrode 180. Wire bonding is performed on lower auxiliary electrode 150 and on upper auxiliary electrode 180. As shown in Table 3, in Example 2, a high capacitance density of 400 pF/mm² was obtained in embedded capacitor unit 400. By wire bonding, no damage occurred in the capacitor. This is considered because, as shown in Example 2, although heat-resistant metal plate 130 had a small thickness of 50 μm, lower auxiliary electrode 150 or upper auxiliary electrode 180 is formed. This is considered because lower auxiliary electrode 150 or upper auxiliary electrode 180 absorb and mitigat force and heat generated at the wire bonding time and suppress the occurrence of microcracks in sintered dielectric 160.

Example 3 in Table 3 is a sample including sintered dielectric 160 containing BTO (K=500) as a dielectric material. In Example 3, stainless foil (thickness 100 μm) containing aluminum is used as heat-resistant metal plate 130. In Example 3, lower electrode 140 and upper electrode 170 are AgPd electrodes. Further, Ag electrodes are provided as lower auxiliary electrode 150 and upper auxiliary electrode 180. Wire bonding is performed on lower auxiliary electrode 150 and on upper auxiliary electrode 180. As shown in Table 3, in Example 3, a high capacitance density of 400 pF/mm² was obtained in embedded capacitor unit 400. Wire bonding neither generated damage in the capacitor. This is considered because of the following. When lower auxiliary electrode 150 and upper auxiliary electrode 180 are formed, lower auxiliary electrode 150 and upper auxiliary electrode 180 absorbs and mitigates force and heat that are generated at the wire bonding time. As a result, the occurrence of microcracks in sintered dielectric 160 is suppressed. Further, even when the die pad is small, wire bonding performance was satisfactory.

Example 4 in Table 3 is a sample including sintered dielectric 160 containing BTO (K=500) as a dielectric material. In Example 4, stainless foil (thickness 100 μm) containing aluminum is used as heat-resistant metal plate 130. In Example 4, lower electrode 140 and upper electrode 170 are AgPd electrodes. Further, AgPd electrodes are provided as lower auxiliary electrode 150 and upper auxiliary electrode 180. Wire bonding is performed on lower auxiliary electrode 150 and on upper auxiliary electrode 180. As shown in Table 3, in Example 4, a high capacitance density of 400 pF/mm² was obtained in embedded capacitor unit 400. Wire bonding neither generated damage in the capacitor. This is considered because of the following. As shown in Example 4, despite thinning the thickness of heat-resistant metal plate 130 to 50 μm, when lower auxiliary electrode 150 and upper auxiliary electrode 180 are formed, lower auxiliary electrode 150 and upper auxiliary electrode 180 absorb and mitigate force and heat generated at the wire bonding time. As a result, the occurrence of microcracks in sintered dielectric 160 is suppressed. Further, even when the die pad was small, wire bonding performance was satisfactory. In the case of Example 2, a problem occurred in wire bonding properties, depending on a size of an area of the die pad.

As shown in Examples 3 and 4, it is clear that, even when the die pad is small, no damage is given to sintered dielectric 160 when lower auxiliary electrode 150 and upper auxiliary electrode 180 are formed of an Ag electrode or an AgPd electrode.

Configuration of Examples 1 to 4 is the same as the configuration shown in FIG. 1.

[Table 3] Example of Comparison Table of Configurations Between Disclosure Product (Examples 1 to 4) in Lead Frame Package QFP (Quad Flat Package) Mounted with Embedded Capacitor Unit According to Present Disclosure and Comparative Examples (Comparative Example, Comparative Examples 1 and 2)

ated in high-speed transmission at a Gpbs level. As a method of measuring high-speed characteristics at the Gbps level, various-standard QFP samples (QFP samples which become lead frames 120 standardized by 216 pins, 24 mm□ are produced. As semiconductor chips 270 to be mounted on QFP samples, the QFP samples are standardized based on one standard by using internally-provided bare high-speed communication LSI) are inserted into a socket on an evaluation board. Then, jitter measurement is executed using an oscilloscope capable of measuring a GHz band waveform. Jitter measured values has a large variation. Therefore, measurement is performed 25 times, using measured value of N=5 five times. An average value of the measured values is shown in Table 4.

TABLE 3

| | Dielectric material | Sheet C electrode | GND metal | Wire bonding properties | Capacitance density | Presence/absence of dielectric damage |
|---|---|---|---|---|---|---|
| Conventional example | None Only decoupling capacitor on main board | None | None LF die pad corresponds to GND | GOOD | 0 | None |
| Comparative Example 1 | None Only decoupling capacitor on main board | Only sheet C lower electrode use GND wire connection | Stainless foil including Al 100 um thickness | GOOD GND side: configured by AgPd + Ag | 0 | None |
| Comparative Example 2 | BTO + epoxy resin K = 30 | Cu Upper Cu + NiAu plating | Lower Cu electrode 18 um thickness | Conditional GOOD Cannot meet when die pad is small | Poor 7 pF/mm² → Mount 0.17 nF | Conditional GOOD |
| Example 1 | BTO K = 500 | AgPd on both upper and lower sides | Stainless foil including Al 50 um thickness | Conditional GOOD Pull strength is insufficient | GOOD 400 pF/mm² → Mount 10 nF | Poor Short circuit occur in 3 pcs out of 5 pcs 2 pcs are non-defective product |
| Example 2 | BTO K = 500 | AgPd + Ag on both upper and lower sides | Stainless foil including Al 50 um thickness | Conditional GOOD Difficult to meet when die pad is small | GOOD 400 pF/mm² → Mount 10 nF | GOOD None |
| Example 3 | BTO K = 500 | AgPd + Ag on both upper and lower sides | Stainless foil including Al 100 um thickness | GOOD Can meet even when die pad is small | GOOD 400 pF/mm² → Mount 10 nF | GOOD None |
| Example 4 | BTO K = 500 | AgPd + AgPd on both upper and lower sides | Stainless foil including Al 100 um thickness | GOOD Can meet even when die pad is small | GOOD 400 pF/mm² → Mount 10 nF | GOOD None |

Next, by using Table 4, transmission characteristics of the lead frame package QFP mounted with the embedded capacitor unit according to the present disclosure will be compared.

Transmission characteristics of the lead frame package QFP mounted with the embedded capacitor unit are evalu-

[Table 4] Example of Comparison Table of Transmission Characteristics Between Disclosure Product (Examples 1 to 4) in Lead Frame Package QFP Mounted with Embedded Capacitor Unit According to Present Disclosure and Comparative Examples (Comparative Example, Comparative Examples 1 and 2)

TABLE 4

|  | Dielectric material | Sheet C electrode | GND metal | Clock jitter average value at 3 Gbps | Clock jitter average value at 6 Gbps | Data Jitter average value at 6 Gbps | Thermal shock reliability |
|---|---|---|---|---|---|---|---|
| Conventional example | None Only decoupling capacitor on main board | None | None LF die pad corresponds to GND | Poor 90 psec | Poor 81 psec | Poor 105 psec | GOOD |
| Comparative Example 1 | None Only decoupling capacitor on main board | Only sheet C lower electrode use GND wire connection | Stainless foil including Al 100 um thickness | Poor 92 psec | Poor 79 psec | Poor 121 psec | GOOD |
| Comparative Example 2 | BTO + epoxy resin K = 30 | Cu Upper Cu + NiAu plating | Lower Cu electrode 18 um thickness | Poor 88 psec | Poor 77 psec | Poor 104 psec | Poor |
| Example 1 | BTO K = 500 | AgPd on both upper and lower sides | Stainless foil including Al 50 um thickness | GOOD 49 psec | GOOD 49 psec | GOOD 78 psec | Poor |
| Example 2 | BTO K = 500 | AgPd + Ag on both upper and lower sides | Stainless foil including Al 50 um thickness | GOOD 47 psec | GOOD 48 psec | GOOD 76 psec | GOOD |
| Example 3 | BTO K = 500 | AgPd + Ag on both upper and lower sides | Stainless foil including Al 100 um thickness | GOOD 47 psec | GOOD 48 psec | GOOD 75 psec | GOOD |
| Example 4 | BTO K = 500 | AgPd + AgPd on both upper and lower sides | Stainless foil including Al 100 um thickness | GOOD 48 psec | GOOD 49 psec | GOOD 83 psec | Poor |

Table 4 is an example of a comparison result of transmission characteristics. Conventional example in Table 4 is an example of transmission characteristics when a capacitor is not contained. Comparative Example 1 in Table 4 is an example of transmission characteristics shown in FIG. 19. Comparative Example 2 in Table 4 is an example of transmission characteristics when a conventional dielectric not sintered is used instead of sintered dielectric 160 as a dielectric. In Table 4, Examples 1 to 4 are best modes according to the present disclosure, such as an example shown in FIG. 1, for example.

The conventional example is literally an ordinary lead frame package, mounted on an evaluation board via a socket. Necessary decoupling capacitors (various capacitance decoupling capacitors of 0.1 µF, 1 µF are mounted) are all mounted on the evaluation board. In the case of the conventional example, a total length of a lead frame, a bonding wire, and a wire on the evaluation board from the LSI power supply terminal to the decoupling capacitor become large. Therefore, ESL (equivalent series inductance) attributable to a wire length increased. As a result, power supply impedance increased. Consequently, in the case of the conventional example, both clock jitter and data jitter at 3 Gbps, 6 Gbps increased, as shown in Table 4. As a result, in the case of the conventional example, internal standard values for satisfying the characteristics as a commercial product was not satisfactory.

For Comparative Example 1, a lead frame package mounted with a embedded capacitor unit is intentionally produced. A wire for the grounding electrode (GND) is connected to the capacitor unit, and only a wire for a power supply (VDD) is directly connected from the semiconductor chip to the lead frame.

In comparing Comparative Example 1 with Examples 3 and 4, configuration elements are substantially the same, and only connection methods of a power supply wire are different. As a result, in the case of Comparative Example 1, a problem occurred in a jitter measured value as high-speed characteristics. Particularly, jitter at both 3 Gbps and 6 Gbps was 30 psec or above. Superiority of jitter appears as an effect of mounting of the capacitor unit and direct connection. There is a clear effect of a short wire, that is, the effect of connecting in low ESL between a power supply terminal of semiconductor chip 270 and a power supply terminal portion of embedded capacitor unit 400.

On the other hand, Comparative Example 2 shows a result of mounting a commercially available sheet-shaped capacitor as a embedded capacitor unit and a result of connection by wire bonding. As shown in Comparative Example 2, a conventional commercially available sheet-shaped capacitor (that is, a sheet-shaped capacitor formed from a thermosetting dielectric paste formed by dispersing a dielectric powder such as BTO in a thermosetting resin such as an epoxy resin) has an advantage of being able to use copper foil for an electrode. However, because the sheet-shaped capacitor has a dielectric layer structure having a dielectric filler which is filled in the resin, a dielectric constant becomes small. According to a result of trial production by the inventors of the present disclosure, a mountable capacitance value was low at about 0.17 nF. Therefore, in the case of Comparative Example 2, although a slight jitter reduction effect was observed, this effect was practically limited to within a range of a measurement variation.

In the case of the sheet-shaped capacitor of trial production as Comparative Example 2, rigidity is low. Therefore, when a lead frame of a small die pad was used, there occurred a large number of parts where formation of wire bonding was difficult. Further, in the case of Comparative Example 2, there was recognized a part where insulation performance of the capacitor following wire bonding was destroyed. A problem is also recognized from the aspect of device establishment.

On the other hand, in Examples 1 to 4 mounted with embedded capacitor unit 400 having a BTO sintered unit formed on a heat-resistant stainless metal unit containing aluminum, remarkable effects of reducing jitter by 30 psec or above are recognized in all initial characteristics as compared with the comparative examples and conventional example.

For example, in Example 1 (in which sintered dielectric 160 containing BTO as a dielectric is used, and lower electrode 140 and upper electrode 170 are used as an AgPd electrode), excellent results were obtained that clock jitter at 3 Gbps was 49 psec, clock jitter at 6 Gbps was 49 psec, and data jitter at 6 Gbps was 78 psec. In Example 1, when a shock resistance experiment was performed, a problem occurred in some cases. However, this problem can be handled as Good by optimizing a shape and the like of QFP.

By summarizing the results of Examples 1 to 4, the following (A), (B), (C) are made clear.

(A) When an electrode configuration that becomes a connection surface of wire bonding is the configuration of only an AgPd electrode, bonding becomes possible but a sufficient electrode thickness cannot be secured and pull strength cannot be secured in some cases. In this case, by performing wire bonding by selectively printing an Ag electrode by about 20 μm on an AgPd electrode as an auxiliary electrode, very satisfactory wire bonding properties can be obtained. That is, damaging the dielectric layer following the bonding can be avoided. Also, losing capacitance density and other dielectric characteristics can be prevented.

(B) When a foil thickness of a heat-resistant stainless metal body containing aluminum was changed to 30 μm, 50 μm, 100 μm, and 200 μm, bonding was difficult at some parts when a die pad size is small at thicknesses of 30 μm and 50 μm, in some cases. Further, at the thicknesses of 30 μm and 50 μm, inconvenience such as bending and deformation occurred in some cases, in the process of mounting embedded capacitor unit 400. On the other hand, when heat-resistant metal plate 130 (or heat-resistant metal foil) having a thickness of 200 μm was employed, a design problem of inability in securing sufficient height for wire bonding occurred and a usable range was limited in some cases. In Table 3 and Table 4, stainless foil containing aluminum (heat-resistant metal plate 130) having thicknesses of only 50 μm and 100 μm is described, and a result in cases of thicknesses of 30 μm, 200 μm, and the like is not described.

(C) When the use of an Ag electrode or an AgPd electrode as an auxiliary electrode was compared as Examples 3 and 4, excellent jitter reduction characteristics were observed in both cases, in the comparison of initial characteristics. However, when a thermal shock test was performed, only when an AgPd electrode was selectively formed in lamination in a large thickness on the AgPd electrode, peel-off occurred in some cases between the electrodes (for example, an interface portion between upper auxiliary electrode 180 and upper electrode 170 in solid formation). In such a case, for lower auxiliary electrode 150 and upper auxiliary electrode 180, it is desirable to increase an Ag proportion in each electrode, to 80 mass % or above, 90 mass % or above, 95 mass % or above. As described above, it is recognized that as an auxiliary electrode material, an Ag electrode is more suitable than an AgPd electrode.

In the present disclosure, a heat-resistant metal plate may be called heat-resistant metal foil. Both the heat-resistant metal plate and the heat-resistant metal foil are substantially the same.

According to the present disclosure, as described above, when a capacitor to be contained in a semiconductor device contains a sintered dielectric formed on a heat-resistant metal plate, the capacitance of the capacitor can be remarkably increased. In performing high-speed signal processing in the electronic device requiring high-speed signal processing such as high vision and 2 k and 4 k, it is possible to substantially reduce jitter and enhance performance of the device.

What is claimed is:

1. A semiconductor device comprising:
 a heat-resistant metal plate containing 0.5 wt % or more and 20 wt % or less aluminum;
 a capacitor part having at least a lower electrode, a sintered dielectric part, and an upper electrode that are formed on one or more surfaces of the heat-resistant metal plate;
 a semiconductor chip fixed on the capacitor part;
 a lead frame;
 a wire for electrically connecting the semiconductor chip to the upper electrode; and
 a mold part in which at least the capacitor part and the semiconductor chip are buried,
 wherein the semiconductor chip and the upper electrode are electrically connected with each other via a first wire,
 the semiconductor chip and the lower electrode are electrically connected with each other via a second wire, and
 the upper electrode and the lead frame are electrically connected with each other via a third wire.

2. The semiconductor device according to claim 1, wherein
 the heat-resistant metal plate is a stainless plate,
 the upper electrode and the lower electrode are sintered electrodes containing silver by 50 wt % or more and 100 wt % or less, and
 the sintered dielectric part is a sintered dielectric formed by sintering, having a thickness of 3 μm or above and 50 μm or below.

3. The semiconductor device according to claim 1, wherein
 the upper electrode is formed of a plurality of upper electrodes, and at least one upper electrode has a width of a peripheral side end portion larger than a width of a center side of the heat resistant metal plate in plan view.

4. A semiconductor device comprising:
 a heat-resistant metal plate containing 0.5 wt % or more and 20 wt % or less aluminum;
 a capacitor part having at least a sintered dielectric part, an upper electrode, and an upper auxiliary electrode in contact with the upper electrode that are formed on one or more surfaces of the heat-resistant metal plate;
 a semiconductor chip fixed on the capacitor part;
 a lead frame;
 a wire for electrically connecting the semiconductor chip to the upper electrode; and
 a mold part in which at least the capacitor part and the semiconductor chip are buried,
 wherein the semiconductor chip and the upper auxiliary electrode are electrically connected with each other via a first wire, the semiconductor chip and the heat-resistant metal plate are electrically connected with each other via a second wire, and the upper electrode and the lead frame are electrically connected with each other via a third wire.

5. The semiconductor device according to claim 4, wherein the upper electrode is formed of a plurality of upper electrodes, and at least one upper electrode has a width of a peripheral side end portion larger than a width of a center side of the heat resistant metal plate in plan view.

6. A semiconductor device comprising:

a heat-resistant metal plate containing 0.5 wt % or more and 20 wt % or less aluminum;

a capacitor part having at least a lower electrode, a sintered dielectric part, an upper electrode, and a lower auxiliary electrode in contact with the lower electrode that are formed on one or more surfaces of the heat-resistant metal plate;

a semiconductor chip fixed on the capacitor part;

a lead frame;

a wire for electrically connecting the semiconductor chip to the upper electrode; and a mold part in which at least the capacitor part and the semiconductor chip are buried, wherein the semiconductor chip and the upper electrode are electrically connected with each other via a first wire, the semiconductor chip and the lower auxiliary electrode are electrically connected with each other via a second wire, and the upper electrode and the lead frame are electrically connected with each other via a third wire.

7. The semiconductor device according to claim 6, wherein the upper electrode is formed of a plurality of upper electrodes, and at least one upper electrode has a width of a peripheral side end portion larger than a width of a center side of the heat resistant metal plate in plan view.

8. An embedded capacitor unit comprising:

a heat-resistant metal plate containing 0.5 wt % or more and 20 wt % or less aluminum;

a lower electrode composed of a sintered electrode containing silver by 50 wt % or more and 100 wt % or less, provided on the heat-resistant metal plate;

a sintered dielectric formed by sintering, having a thickness of 3 µm or above and 50 µm or below, and formed on the lower electrode; and a plurality of upper electrodes composed of a sintered electrode containing silver by 50 wt % or more and 100 wt % or less, formed on the sintered dielectric.

9. The embedded capacitor unit according to claim 8, wherein at least one of the upper electrodes has a width of a peripheral side end portion larger than a width of a center side of the heat resistant metal plate in plan view.

10. A semiconductor package comprising:

a semiconductor device including:

a heat-resistant metal plate containing 0.5 wt % or more and 20 wt % or less aluminum;

a capacitor part having at least a lower electrode, a sintered dielectric part, and an upper electrode that are formed on one or more surfaces of the heat-resistant metal plate;

a semiconductor chip fixed on the capacitor part;

a lead frame;

a wire for electrically connecting the semiconductor chip to the upper electrode; and a mold part in which at least the capacitor part and the semiconductor chip are buried, the semiconductor chip and the upper electrode being electrically connected with each other via a first wire, the semiconductor chip and the lower electrode being electrically connected with each other via a second wire, and the upper electrode and the lead frame being electrically connected with each other via a third wire; and a wiring board mounted with the semiconductor device.

11. The semiconductor package according to claim 10, wherein the upper electrode is formed of a plurality of upper electrodes, and at least one upper electrode has a width of a peripheral side end portion larger than a width of a center side of the heat resistant metal plate in plan view.

12. A method of manufacturing an embedded capacitor unit, the method comprising:

a providing process of providing a heat-resistant metal plate containing 0.5 wt % or more and 20 wt % or less aluminum;

a lower-electrode printing process of printing a first electrode paste containing silver, on the heat-resistant metal plate;

a dielectric printing process of printing a dielectric paste, on the lower electrode;

an upper-electrode printing process of printing a second electrode paste containing silver, on the dielectric; and a firing process of firing the first electrode paste, the dielectric paste, and the second electrode paste, individually or collectively, at a temperature of 850° C. or above and 950° C. or below.

13. The method of manufacturing an embedded capacitor unit according to claim 12, wherein the upper electrode is formed of a plurality of upper electrodes, and at least one upper electrode has a width of a peripheral side end portion larger than a width of a center side of the heat resistant metal plate in plan view.

* * * * *